United States Patent [19]

Noreika et al.

[11] 4,213,781

[45] Jul. 22, 1980

[54] DEPOSITION OF SOLID SEMICONDUCTOR COMPOSITIONS AND NOVEL SEMICONDUCTOR MATERIALS

[75] Inventors: Alexander J. Noreika; Maurice H. Francombe, both of Pittsburgh, Pa.

[73] Assignee: Westinghouse Electric Corp., Pittsburgh, Pa.

[21] Appl. No.: 962,344

[22] Filed: Nov. 20, 1978

Related U.S. Application Data

[60] Continuation of Ser. No. 602,493, Aug. 6, 1975, abandoned, which is a division of Ser. No. 381,653, Jul. 23, 1973, Pat. No. 3,979,271.

[51] Int. Cl.$^2$ ............... C01C 15/00; B44D 1/02; H01L 7/36
[52] U.S. Cl. ............... 75/134 P; 75/134 G; 75/134 R; 75/134 S; 75/134 T; 148/175
[58] Field of Search .......... 75/134 T, 134 P, 134 G, 75/134 S, 134 R, 134 N, 134 B; 148/171, 175

[56] References Cited

U.S. PATENT DOCUMENTS

| | | | |
|---|---|---|---|
| 2,830,239 | 4/1958 | Jenny | 317/237 |
| 3,266,952 | 8/1966 | McCaldin | 148/33 |
| 3,560,275 | 2/1971 | Kressel et al. | 148/71 |
| 3,716,404 | 2/1973 | Hirao et al. | 117/201 |
| 3,979,271 | 9/1976 | Noreika et al. | 204/192 |

OTHER PUBLICATIONS

Rado et al., "Si in LPE-grown $GA_{1-x}Al_xAs$ ...", J. Appl. Phys., 43, (1972), 4816.
Semiconductors & Semimetals, vol. 4, Ed. Willardson et al., Acad. Press, N.Y., 1968, pp. 413–424.

Primary Examiner—R. Dean
Assistant Examiner—Upendra Roy
Attorney, Agent, or Firm—C. L. Menzemer

[57] ABSTRACT

Solid layer semiconductor compositions are deposited by the simultaneous sputtering from a sputter target and electrically discharge a reacting gas preferably by application of an RF potential. Preferably, the method is used to make solid solution layers and most desirably solid solution epitaxial layers of at least two semiconductor materials. The method may be used to make novel metastable compositions such as $(GaAs)_{1-x}Si_x$, $(GaAs)_{1-x} Ge_x$, $(InSb)_{1-x} Si_x$, $(InSb)_{1-x}Ge_x$, $(InAs)_{1-x}Si_x$ and $(InAs)_{1-x} Ge_x$ (where x is a number greater than about 0.01, and $x+(1-x)=1$, and $Ga_xAs_ySi_z$, $Ga_xAs_yGe_z$, $In_xSb_ySi_z$, $In_xSb_yGe_z$, $In_xAs_ySi_z$, $In_xAs_yGe_z$ and $In_xSb_yAs_z$ (where x, y and z are numbers greater than about 0.01, and $x+y+z=1$).

19 Claims, 5 Drawing Figures

DEPOSITION OF SOLID SEMICONDUCTOR COMPOSITIONS AND NOVEL SEMICONDUCTOR MATERIALS

FIELD OF THE INVENTION

This is a continuation of application Ser. No. 602,493, filed Aug. 6, 1975, now abandoned, which is a division of application Ser. No. 381,653 filed July 23, 1973, U.S. Pat. No. 3,979,271.

The present invention relates to the making of semiconductor devices and particularly semiconductor devices with electrical parameters intermediate or outside the range of those imparted by conventional semiconductor materials.

BACKGROUND OF THE INVENTION

The ability to vary the parameters such as the energy bandgap, carrier mobility, and thermal conductivity of semiconductor materials is crucial to the making of certain semiconductor devices. Actually this involves the making of new semiconductor materials. Devices such as infrared filters and detectors, visible and infrared emitting diodes and heterojunction devices with certain capabilities require semiconductor compositions with properties intermediate or outside the range of conventional semiconductor materials. A method used to achieve these non-conventional properties is by forming a solid solution of two or more semiconductor materials.

However, many alloyed semiconductor materials which are of considerable interest for making devices have components which are not readily miscible or are essentially immiscible in each other. Annealing for months or longer is required to achieve some measure of equilibrium with certain semiconductor materials and certain composition ranges of certain semiconductor materials. For example, $InAs_xSb_{1-x}$ alloys, which are sensitive to radiation between 3–12 $\mu$m and are useful in infrared emitting diodes and detectors, take about three months to anneal, see Woolley, J. C. and Smith, B. A., Proc. Phys. Soc., 72, 214 (1958). Similarly $Ga_xIn_{1-x}Sb$ alloys require an annealing time of eight (8) weeks to achieve substantial equilibrium, see Woolley, J. C. and Smith, B. A., Proc. Phys. Soc., 72, 214 (1958).

Numerous techniques have been utilized experimentally to achieve miscibility more rapidly with certain compositions and ranges of compositions. In bulk materials, directional freezing has, for example, been partly successful in alloying some compositions of $InAs_xSb_{1-x}$, see Woolley, J. C. and Warner, J., J. Electrochem. Soc. 111, 1142 (1964). Zone recrystallization of $InAs_xSb_{1-x}$ alloys has also achieved a measure of success, although homogeneous compositions in the range $0.5 < x < 0.8$ have been difficult to obtain, see Woolley, J. C. and Warner, J., J. Electrochem. Soc. 111, 1142 (1964). Quenching and Czochralski methods have also been used to produce semiconductor alloys, see Hilsum, C., "Proc. of the International Conference on the Physics of Semiconductors", p. 1127, Dunod, Paris (1964), and Sirota, N. N. and Bolvanovich, E. I., Dokl. Akad, Nauk B.S.S.R. 11, 593 (1967).

Thin film techniques have also been able to extend the miscibility of certain compositions. For example, vapor quenching of metals, see Mader, S. in The Use of Thin Films in Physical Investigations, ed. J. C. Anderson, 1966, Academic Press, p. 433, splat cooling of Ga in GaSb, see Duwez, P., Willens, R. H. and Klement, W. Jr., J. Appl. Phys., 31, 1500 (1960), and flash evaporation of several III-V Group alloys including (Ga, In), (As, P) and $GaSb_xP_{1-x}$, see Richards, J. L., in the The Use of Thin Films in Physical Investigations, ed J. C. Anderson, 1966, Academic Press, p. 416, have been found to produce homogeneous alloy layers in limited composition ranges between components which are not readily miscible in bulk form. These layers, however, are usually amorphous or polycrystalline, rather than epitaxial.

Formation of epitaxial layers is especially important where the electrical characteristics of the desired device are related to semiconductor parameters, such as carrier mobility, which are defect sensitive. No difficulty has been encountered in preparing alloyed layers of the various semiconductor compositions by epitaxial techniques, e.g. chemical vapor deposition and liquid phase epitaxy, when miscibility of the components is readily achieved in bulk form. However, with other semiconductor components where miscibility is limited in bulk, chemical vapor deposition and liquid phase epitaxy produce epitaxial films of only limited miscibility, see Stringfellow, G. B. and Green, P. E., J. Electrochem. Soc., 118, 805 (1971).

The present invention overcomes these limitations and shortcomings. It provides a way of readily making substantially homogeneous compositions of previously reported immiscible, slowly miscible or partially miscible semiconductor component materials. Moreover, the invention provides a way of producing these compositions, some of which are known and some of which are novel, in epitaxial layers.

SUMMARY OF THE INVENTION

A method is provided for depositing a solid layer semiconductor composition on a substrate. Materials for formation of the semiconductor composition are simultaneously sputtered from a sputter target and electrically discharge reacted from a reactive gas preferably by application of an RF potential.

Preferably, the method is used to epitaxially grow a substantially homogeneous layer of at least two semiconductor materials. The steps include forming at least one sputter target containing at least a first semiconductor component material, disposing the formed sputter target and a substrate prepared for epitaxial growth in a spaced relation in a partial vacuum chamber, introducing into the vacuum chamber at least one reactive gas composition containing at least a second semiconductor material, depositing the first semiconductor component material on the substrate by sputtering, and simultaneously reacting the reactive gas by electrical discharge and depositing the second semiconductor component material on the substrate. The sputter targets and reactive gases containing all component materials necessary for forming either directly, or by chemical reaction with another gas or target material, the semiconductor materials desired in the miscible semiconductor layer.

The method may also be utilized to make sputter targets of two or more semiconductor compositions so that the compositions may be simultaneously sputtered.

Moreover, it has been found that the method can readily form substantially homogeneous compositions of novel metastable semiconductor materials previously reported essentially immiscible or partially miscible. In addition, other novel semiconductor materials have been produced by the present invention.

Other details, objects and advantages of the invention will become apparent as the following description of the present preferred embodiments thereof and present preferred means for practicing the same proceeds.

BRIEF DESCRIPTION OF THE DRAWINGS

In the accompanying drawings the present preferred embodiments of the invention and the present preferred means for practicing the same are shown, in which.

DESCRIPTION OF THE PREFERRED EMBODIMENTS

Figure 1:
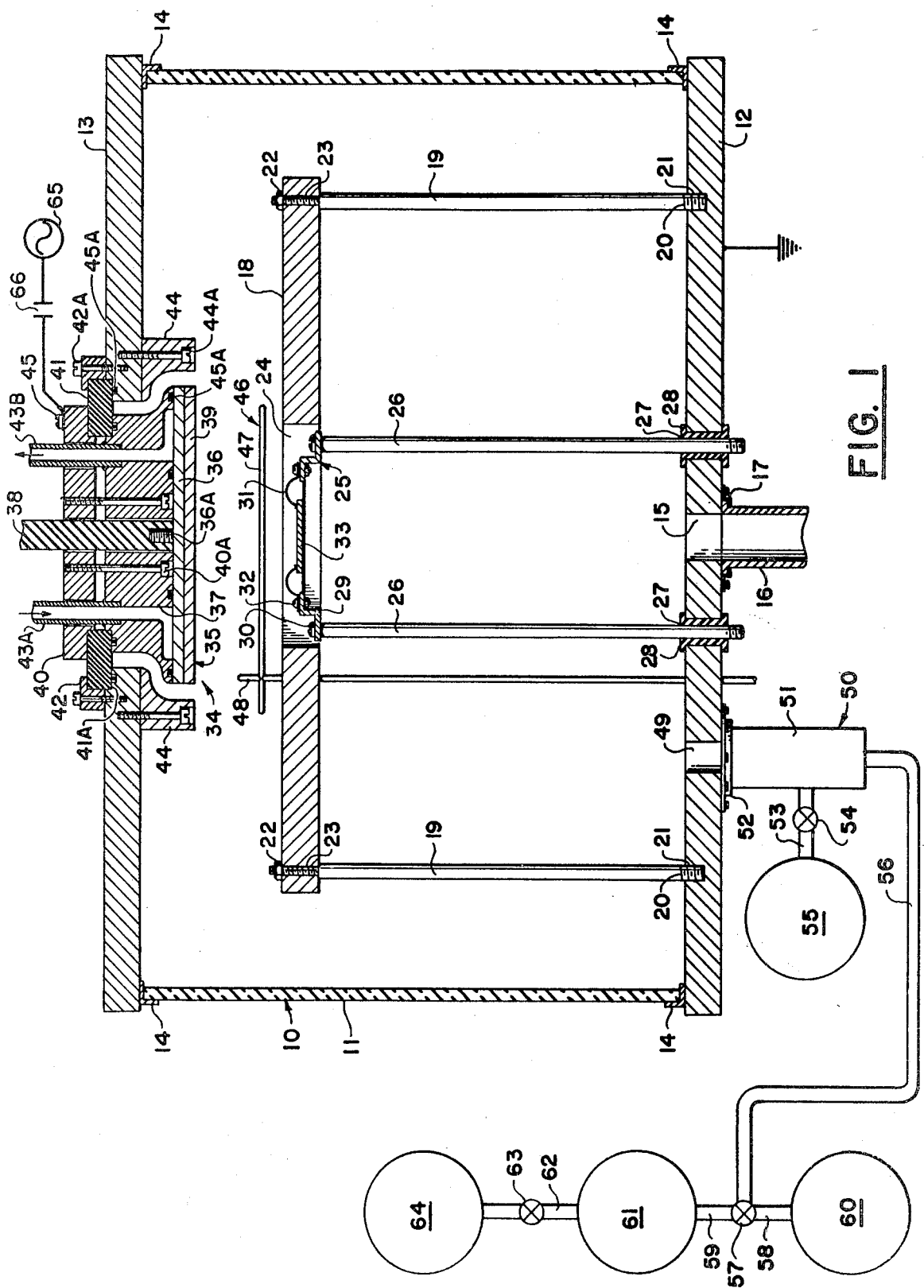
FIG. 1 is a cross-sectional view in elevation, with portions shown schematically, of an electrical discharge—sputtering apparatus suitable for performing and making the present invention.

Referring to FIG. 1, apparatus is shown for growing a solid layer preferably of two or more semiconductor materials in accordance with the present invention. Hermetically sealed chamber 10 is comprised of cylindrical side surfaces 11 of non-porous material such as metal, glass or recrystallized ceramic typically vertically positioned, and circular end caps 12 and 13 typically of an electrically conductive material such as low carbon steel or aluminum typically horizontally positioned. Cylindrical side surfaces 11 are hermetically sealed to the end caps 12 and 13 by standard L-shaped seals 14 to provide the ease in disassembly of the chamber 10 for disposition and removal of apparatus to and from the chamber.

A vacuum port 15 is provided in end cap 12 at the center. Vacuum port 15 is hermetically sealed to conduit 16 by flange 17. The conduit 16 communicates with a standard oil diffusion, vacuum pump (not shown) to enable a partial vacuum to be established and maintained in chamber 10 after it is hermetically sealed. Also positioned in conduit 16 between chamber 10 and the vacuum pump is a standard liquid nitrogen cold trap (not shown) to remove volatile reaction products formed by the electrical discharge reaction of the reactive gas as hereinafter described.

Disposed in the chamber 10 is ground electrode 18. Ground electrode 18 is horizontally mounted by a plurality of vertical extending rods 19 which have end portions 20 threaded into threaded openings 21 in end cap 12. Rods 19 also have threaded end portions 22 extending through threaded nuts 23 thereon to rigidly fasten and support ground electrode 18. Rods 19 also electrically connect ground electrode 18 with end cap 12 which is in turn electrically grounded as indicated.

Ground electrode 18 is annularly shaped with a rectangular slot 24 at its center. Disposed in the rectangular slot 24 is substrate holder assembly 25 of rectangular shape supported by rods 26 thereof. Rods 26 are electrically coupled to a power source (not shown) through openings 27 in end cap 12. Rods 26 are supported in openings 27 by insulating grommets 28 which also hermetically seal and electrically insulate the rods 26 from the end cap 12. Sample holder assembly 25 also includes horizontally positioned substrate holder 29 of rectangular shape which is fastened to the ends of rods 26 by cap screws 30. Substrate holder 29 has a raised thin central portion (e.g. 5 mils in thickness) and a thick L-shaped periphery portion (e.g. 60 mils in thickness) to provide a high electrical resistance region at the central portion where substrate 33 is supported. Assembly 25 also includes mechanically bias means 31 fastened to the substrate holder 29 by cap screws 32. By this arrangement substrate 33 can be mounted in the assembly 25 by mechanically biasing the bias means 31 against the substrate holder 29. The substrate holder 29 is electrically connected via rods 26 to the exterior of chamber 10 while being electrically insulated from end cap 12.

Also disposed within the chamber 10 centrally through end cap 13 is sputtering electrode assembly 34. Electrode assembly 34 is comprised of circular target assembly 35 mounted centrally of hollow backing plate 37 and provided with O-ring seals 45A to maintain both hermetic and water seals between plate 37 and target assembly 35. Target assembly 35 consists of a circular sputter electrode 36 having a central threaded integral stem 36A to provide for mounting by threading into insulator core 38 positioned centrally of and insulated from backing plate 37. Target assembly 35 also includes sputter target 39 which overlies electrode 36. Target 39 consists of material, preferably one or more semiconductor materials, desired to be deposited as a layer on substrate 33. The thickness of target 39 is not important to the sputtering operation but is typically about $\frac{1}{8}$ to $\frac{1}{4}$ inch in thickness.

Electrode assembly 34 is fastened to but electrically insulated from end cap 13 by threading cap screws 40A through backing plate 37 into circular metal cap 40 to clamp fasten to insulator ring 41. Insulator ring 41 is centrally seated in groove 41A formed in end cap 13 and backing plate 37 and hermetically sealed to cap 13 and plate 37 by O-ring seals 45. Insulator ring 41 is sealed with and fastened to end cap 13 by clamping ring 42 which seats at the outer periphery of ring 41 and cap screws 42A extending through ring 42 and threading into cap 13.

Cooling of target assembly 35 is accomplished by water circulated through the passageways formed by sputter electrode 36, backing plate 37 and O-ring seals 45A. The water is fed to and exited from the assembly through conduits 43A and 43B, respectively, which slip through cap 40 and seat in and are welded to the upper portion of backing plate 37.

Around electrode assembly 34 is provided an annular shield 44 which is electrically insulated from assembly 34. Shield 44 is fastened to end cap 13 by cap screws 44A which extend through shield 44 and thread into end cap 13 and is grounded through end cap 13. Shield 44 extends downwardly from cap 13 to have its end portion flush with the outside surface of sputter target 39. By this arrangement, shield 44 suppresses discharge on the backside of electrode assembly 34 and thus prevents sputtering of metal from the electrode assembly. The distance between shield 44 and sputter electrode assembly 34 is critical to suppress sputtering, a spacing of approximately 0.5 centimeter being suitable. The distance between sputter target 39 and ground electrode 18 is also critical to the deposition rate by sputtering as well as electrical discharge and preferably maintained at a distance of about 2.0 centimeters.

Also disposed within chamber 10 is shutter assembly 46. Assembly 46 includes a shutter 47 disposed horizontally between ground electrode 18 and sputter target 39. Shutter 47 is fastened to rod 48 which is positioned off center and extends upwardly through end cap 12 and ground electrode 18. By this arrangement shutter assembly 46 is able to pivot shutter 47 from its position between electrodes 18 and target 39 to expose substrate 33 to the influx of the target material and the reactive gas material.

Also attached to chamber 10 at port 49 is a gas feed assembly 50 to provide for gases necessary to electrical reaction and sputtering in the chamber 10. Feed assembly 50 includes a mixer means 51 hermetically sealed to end cap 12 over port 49 by flange 52. Mounted for inlet into mixer 51 through conduit 53 and valve 54 from pressurized vessel 55 is a gas such as argon suitable for use to support the ionization for sputtering. Also attached for axial inlet to mixer 51 is conduit 56 with 3-way valve 57. In turn connected to inlets of 3-way valve 57 are conduits 58 and 59 to pressurized vessels 60 and 61, respectively. Also attached to pressurized vessel 61 opposite conduit 59 is conduit 62 which is in turn attached through valve 63 to pressurized vessel 64. By this arrangement, gas feed assembly 50 can inlet to chamber 10 a mixture of ionization gas suitable for the sputtering and a reaction gas appropriate for electrical discharge reaction. Reaction gases which are in the gaseous form at the pressures involved are inputted to the system by disposition in vessel 60. Reaction gases which are in liquid form at the pressures involved and must be inputted to the system as a vapor in a carrier gas are disposed in chamber 61; pressurized chamber 64 contains a suitable carrier gas such as argon which is bubbled through the liquid disposed in vessel 61 by opening Also applied to sputter electrode 36 through contact 45, cap 40, backing plate 37 is an electric potential from a power supply 65 suitable to provide both sputtering of target 39 and electrical discharge reaction of the reactive gas. The potential will vary with the composition of target 39 and the reactive gas. Typically, the power supply is an RF source of a voltage of 1000 to 3500 volts at a frequency in excess of a few MHz (e.g. 13.56 MHz) and a power of 0.5 to 5 kilowatts. No DC potential will build up if the frequency of the applied voltage is too low because enough ions reach the target surface during the negative half of each cycle to neutralize the negative surface charge. The lower the frequency the higher the voltage must be to provide the ionization needed for sputtering. At higher frequencies, fewer ions reach the target surface in one cycle, in turn increasing the negative bias and increasing the field across the dark space (as hereinafter described) and increasing the sputtering rates. Capacitor 66 is also provided between the power supply and the sputter electrode to prevent a DC current flow in the circuit and thus allows build up of a negative bias at the sputter target 39.

The optimum power supply is also dependent on the pressure of the ionizing gas (e.g. argon) and reaction gas mixture in the chamber and the geometry of the system. Typically, the pressure of the mixture is 1 to 5 millitorr. RF power supplies of 1 to 5 kilowatt have been used successfully with the higher powers related to the larger area electrodes. Higher deposition rates are also obtained with higher power supplies so that the power supply is one of the principle regulatory parameters of the system along with the gas pressure in chamber 10.

In any event, the electric potential is applied across the space between target 39 and electrode 18 by grounding electrode 18 through end cap 12. Electrode 18 is much larger, typically 14 inches in diameter, than target 39, which is typically 4 inches in diameter, to provide the desired bias in ion bombardment so that sputter deposition occurs at the substrate.

Another regulatory parameter of both the deposition rate and the orientation behavior of the deposited layer is the temperature of the substrate. The heating is achieved by passing a high electric current through substrate holder 29 by applying a potential through rods 26. The thin central portion of holder 29 provides a high resistance region where heating of the substrate can be accomplished. Highest deposition rates are achieved at lowest substrate temperature. Thus the temperature of the substrate is regulated to strike a balance between deposition rate and the nature of the growth desired.

Heating of the substrate is primarily important to determine the orientation behavior of the grown layer. At lower temperature, typically less than about 300° C., the layer formed on the substrate is amorphous. Heating is typically to above 300° C. to provide polycrystalline growth and typically to above 500° C. to provide highly oriented, epitaxial growth. The exact temperature appropriate for polycrystalline and epitaxial growth will vary with the substrate material and the crystal orientation of the substrate used. Typically for a gallium arsenide substrate, growth is achieved above 300° C. and epitaxial growth is achieved between 530° and 650° C. Temperatures between 530° and 650° C. can be obtained with electric currents in the range of 6 volt–200 amp. Higher temperatures of approximately 700° to 800° C. may be needed for epitaxial growth on silicon substrates; however, this temperature is still substantially below the temperature required for epitaxial growth by pyrolysis (i.e. about 1100°–1200° C.).

It should also be noted that the structure of the epitaxial layer is also dependent on the crystal structure and crystal orientation of the substrate as is well known in the art. For an epitaxial layer, a single crystal substrate should be used which provides a reasonably close match to the lattice structure and lattice dimensions of the layer to be grown. Further, the substrate should be cleaned, lapped and polished prior to deposition to minimize defects in the epitaxially grown layer. It is also well known generally in epitaxy technology that the crystal orientation of the surface of the substrate on which the epitaxial layer is grown is important to the growth rate of the layer. It should also be noted in this connection the epitaxial structure may be lost and strains may be introduced in the layer if the layer is substantially thick because of the difference in lattice spacings between the substrate and the epitaxial layer.

Figure 2:
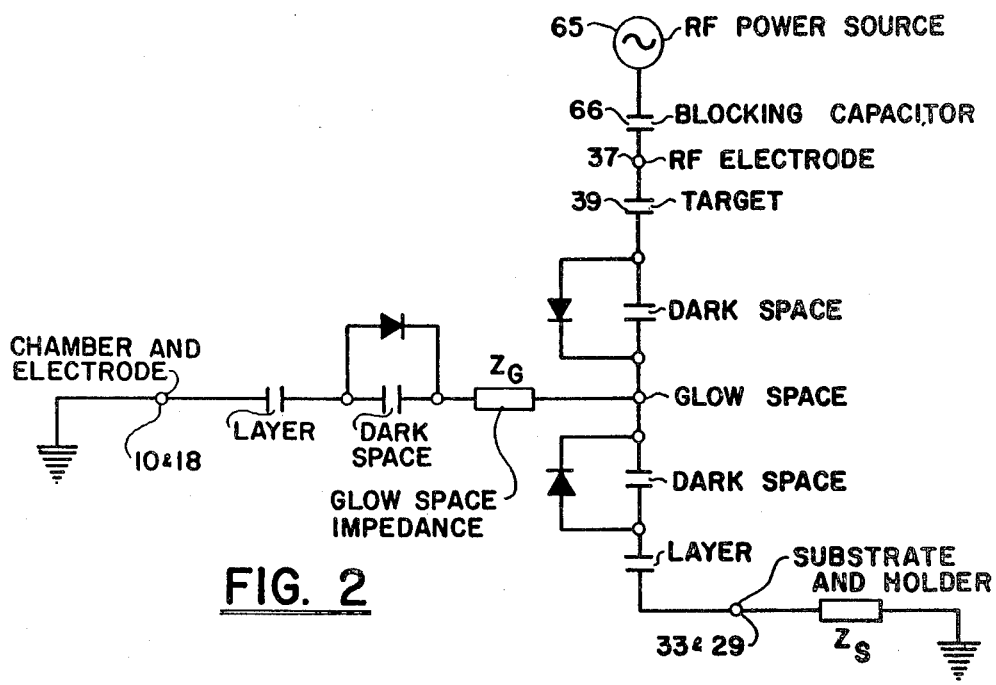
FIG. 2 is a schematic of the equivalent electrical circuit for the sputtering operation of the apparatus of FIG. 1.

Referring to FIG. 2, the operation of the invention is described by reference to the equivalent circuit for the sputter deposition and discharge reaction in accordance with the present invention. In sputtering, a glow space is formed between the target 39 and electrode 18 by oscillating electrons in the electric field so that they make elastic collisions with gas atoms to cause ionization of the gas. Dark spaces form between the electrode and the glow space. The potential difference between the electrode, which is to a first order capacitive, is taken almost entirely across the dark spaces and is represented by capacitors, the glow space being at a near-uniform potential. Further, due to the large difference in ion and electron mobilities, the glow space potential is always a higher potential than the electrode surfaces and rectifying action occurs at the glow space boundaries, represented by the diodes. Some ion conduction is directed to the walls and surfaces of chamber 10 and electrode 18 as well as the substrate holder 29 and substrate 33, as shown in FIG. 2, but such conduction is minimized by proper dimensioning of target 39 and electrode 18. See also Koenig and Maissel, IBM J. Res. Develop. 14, 168, (March, 1970), Logan, IBM J. Res. Develop. 14, 172, (March, 1970), Maissel, Jones and Standley, IBM J. Res. Develop. 14, 176, (March, 1970), Logan, Maddocks and Davidse IBM J. Res. Develop. 14, 182, (March, 1970), and Mazza, IBM J. Res. Develop. 14, 192, (March, 1970).

The reaction or decomposition of the reactive gas also occurs in the glow space. The oscillation of the electrons causing heating so that high temperatures generated within the gaseous molecules causes their reaction and decomposition to the deposited semiconductor material and a volatile gas or gases which are exhausted into the vacuum system and collected in the coldtrap described above. Again, this reaction and/or decomposition occurs at much lower temperatures than is necessary for pyrolytic decomposition, although the substrate is heated as above described to control the crystal structure of the grown layer.

In operation, a brief clean-up sputtering in argon or other suitable inert gas is first performed. A reactive gas, containing the semiconductor material, is then leaked into chamber 10 from gas feed assembly 50 mixed with argon or other inert gas to support sputtering. The shutter 46 is pivoted to expose the substrate 33 and the growth is then commenced by simultaneously sputtering the target material and electrically reacting the reactive gas. The relative percentages of the components in the deposited composition is controlled by adjusting the proportion of reactive gas to argon and the deposition rate. In this connection, it should be noted that both the deposition rate of the sputtered and reactive gas components are dependent on the applied voltage of power supply 65. Epitaxial growth is facilitated by the use of polished, cleaned and heated single crystal substrates which are reasonably well matched to the structure and lattice dimensions of the epitaxially grown layer.

The present invention is particularly useful in epitaxially growing a miscible solid layer of two or more semiconductor materials which were previously considered immiscible, or which were previously considered miscible only by long anneals. Such miscible layers are found to be metastable on heating to temperatures several hundred degrees above the growth temperature. In addition, growth can proceed at temperatures low enough to favor greatly extended solid solubility. Amorphous, polycrystalline and single crystal layers of IV-IV, III-V and II-VI semiconductor compounds can thus be epitaxially prepared relatively readily.

Table I furnishes examples of solid solution preparation using various alternatives for both the target composition and for the composition of the reactive gas. One of the important advantages of the method derives from the ease with which the reactive gas species, e.g., $GeH_4$, $Bi(CH_3)_3$, etc., can be decomposed in a confined electrical discharge allowing the freed metal component to combine with the elements transported by sputtering to form an intimately mixed substantially homogeneous composition at the substrate surface.

TABLE 1
EXAMPLES OF SOLID SOLUTIONS AND PREPARATIVE SPUTTER TARGETS AND REACTIVE GASES

| Solid Solution Composition | Sputter Target Composition | Reactive Gas Composition | Energy Gap e.v. at rm. temp. |
|---|---|---|---|
| $Si_{1-x}Ge_x$[1] | Si | $GeH_4$ or $Ge(CH_3)_3$ | 1.08 to 0.66 |
| $Ge_{1-x}Si_x$[1] | Ge | $SiCl_4$ or $SiH_4$ | 1.08 to 0.66 |
| $(InSb)_{1-x}(InAs)_x$[1] | InSb | $AsH_3$ & $In(CH_3)_3$ | 0.17 to 0.10 to 0.36 |
| $(InAs)_{1-x}(InSb)_x$[1] | InAs | $SbH_3$ & $In(CH_3)_3$ | 0.17 to 0.10 to 0.36 |
| $(InSb)_{1-x}Bi_x$[1] | InSb | $Bi(CH_3)_3$ | <0.17 |
| $(InSb)_{1-x}Si_x$[1] | InSb | $SiH_4$ or $SiCl_4$ | 0.17 to 1.08 |
| $(InSb)_{1-x}Ge_x$[1] | InSb | $GeH_4$ or $Ge(CH_3)_3$ | 0.17 to 0.66 |
| $(CdTe)_{1-x}Hg_x$[1] | CdTe | Hg (vapor) | 0.18 to 0 to 1.45 |
| $(CdTe0_{1-x}(HgTe)_x$[1] | CdTe | Hg (vapor) & $(C_2H_5)_2Te$ | 0.18 to 0 to 1.45 |
| $(PbTe)_{1-x}(SnTe)_x$[1] | PbTe | $Sn(CH_3)_4$ & $(C_2H_5)_2Te$ | 0.25 to 0 to 0.22 |
| SiC | C | $SiH_4$ | ~3.0 |

[1]Where x is a number greater than about 0.01 and $x + (1-x) = 1$

As can be seen from Table I, a number of known semiconductor compositions are readily produced by the present method, which compositions were previously reported as only partially miscible or "slow to equilibrate", requiring long annealing times.

Referring to Table II, the present invention is also able to produce novel semiconductor compositions previously not known. Table II contains examples of compositions known and contemplated to be made by use of the present invention and is clearly not exhaustive.

TABLE II
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaAs)_{1-x}Si_x$[1] | GaAs | $SiH_4$ or $SiCl_4$ |
| $(GaAs)_{1-x}Ge_x$[1] | GaAs | $GeH_4$ or $Ge(CH_3)_3$ |
| $(GaSb)_{1-x}Si_x$[1] | GaSb | $SiH_4$ or $SiCl_4$ |
| $(GaSb)_{1-x}Ge_x$[1] | GaSb | $GeH_4$ or $Ge(CH_3)_4$ |

TABLE II-continued
EXAMPLES OF NOVEL SOLID SOLUTIONS AND
PREPARATIVE SPUTTER TARGETS AND REACTIVE GASES

| Solid Solution composition | Sputter Target Composition | Reactive Gas Composition |
|---|---|---|
| $(GaP)_{1-x} Si_x^{(1)}$ | GaP | $SiH_4$ or $SiCl_4$ |
| $(GaP)_{1-x} Ge_x^{(1)}$ | GaP | $GeH_4$ or $Ge(CH_3)_3$ |
| $Ga_x As_y Si_z^{(2)}$ | Ga or Si | $AsH_3$ & $SiH_4$ or $Ga(CH_3)_3$ & $AsH_3$ |
| $Ga_x As_y Ge_z^{(2)}$ | Ga | $AsH_3$ & $GeH_4$ |
| $Ga_x Sb_y Si_z^{(2)}$ | Ga | $Sb(CH_3)_3$ & $SiH_4$ |
| $Ga_x Sb_y Ge_z^{(2)}$ | Ga | $Sb(CH_3)_3$ & $Ge(CH_3)_3$ |
| $Ga_x P_y Si_z^{(2)}$ | Ga | $PH_3$ & $SiH_4$ |
| $Ga_x P_y Ge_z^{(2)}$ | Ga | $PH_3$ & $GeH_4$ |
| $(GaAs)_x Si_y Ge_z^{(2)}$ | GaAs | $SiH_4$ & $GeH_4$ |
| $(GaSb)_x Si_y Ge_z^{(2)}$ | CaSb | $SiH_4$ & $GeH_4$ |
| $(GaP)_x Si_y Ge_z^{(2)}$ | GaP | $SiH_4$ & $GeH_4$ |
| $(BN)_{1-x} Si_x^{(1)}$ | BN | $SiH_4$ or $SiCl_4$ |
| $(AlN)_{1-x} Si_x^{(1)}$ | AlN | $SiH_4$ or $SiCl_4$ |
| $(GaN)_{1-x} Si_x^{(1)}$ | GaN | $SiH_4$ or $SiCl_4$ |
| $(InN)_{1-x} Si_x^{(1)}$ | InN | $SiH_4$ or $SiCl_4$ |
| $(BP)_{1-x} Si_x^{(1)}$ | BP | $SiH_4$ or $SiCl_4$ |
| $(AlP)_{1-x} Si_x^{(1)}$ | AlP | $SiH_4$ or $SiCl_4$ |
| $(AlSb)_{1-x} Si_x^{(1)}$ | AlSb | $SiH_4$ or $SiCl_4$ |
| $(InP)_{1-x} Si_x^{(1)}$ | InP | $SiH_4$ or $SiCl_4$ |
| $(AlAs)_{1-x} Si_x^{(1)}$ | AlAs | $SiH_4$ or $SiCl_4$ |
| $(InAs)_{1-x} Si_x^{(1)}$ | InAs | $SiH_4$ or $SiCl_4$ |
| $(BN)_{1-x} Ge_x^{(1)}$ | BN | $GeH_4$ or $Ge(CH_3)_4$ |
| $(AlN)_{1-x} Ge_x^{(1)}$ | AlN | $GeH_4$ or $Ge(CH_3)_4$ |
| $(GaN)_{1-x} Ge_x^{(1)}$ | GaN | $GeH_4$ or $Ge(CH_3)_4$ |
| $(InN)_{1-x} Ge_x^{(1)}$ | InN | $GeH_4$ or $Ge(CH_3)_4$ |
| $(BP)_{1-x} Ge_x^{(1)}$ | BP | $GeH_4$ or $Ge(CH_3)_4$ |
| $(AlP)_{1-x} Ge_x^{(1)}$ | AlP | $GeH_4$ or $Ge(CH_3)_4$ |
| $(AlSb)_{1-x} Ge_x^{(1)}$ | AlSb | $GeH_4$ or $Ge(CH_3)_4$ |
| $(InP)_{1-x} Ge_x^{(1)}$ | InP | $GeH_4$ or $Ge(CH_3)_4$ |
| $(AlAs)_{1-x} Ge_x^{(1)}$ | AlAs | $GeH_4$ or $Ge(CH_3)_4$ |
| $(InAs)_{1-x} Ge_x^{(1)}$ | InAs | $GeH_4$ or $Ge(CH_3)_4$ |
| $(AlSb)_{1-x} Ge_x^{(1)}$ | AlSb | $GeH_4$ or $Ge(CH_3)_4$ |
| $(InSb)_{1-x} Si_x^{(1)}$ | InSb | $SiH_4$ or $SiCl_4$ |
| $(InSb)_{1-x} Ge_x^{(1)}$ | InSb | $GeH_4$ or $Ge(CH_3)_4$ |
| $(BN)_{1-x} Sn_x^{(1)}$ | BN | $Sn(CH_3)_4$ |
| $(AlN)_{1-x} Sa_x^{(1)}$ | AlN | $Sn(CH_3)_4$ |
| $(GaN)_{1-x} Sa_x^{(1)}$ | GaN | $Sn(CH_3)_4$ |
| $(InN)_{1-x} Sn_x^{(1)}$ | InN | $Sn(CH_3)_4$ |
| $(BP)_{1-x} Sn_x^{(1)}$ | BP | $Sn(CH_3)_4$ |
| $(AlP)_{1-x} Sn_x^{(1)}$ | AlP | $Sn(CH_3)_4$ |
| $(GaP)_{1-x} Sn_x^{(1)}$ | GaP | $Sn(CH_3)_4$ |
| $(InP)_{1-x} Sn_x^{(1)}$ | InP | $Sn(CH_3)_4$ |
| $(AlAs)_{1-x} Sn_x^{(1)}$ | AlAs | $Sn(CH_3)_4$ |
| $(GaAs)_{1-x} Sn_x^{(1)}$ | GaAs | $Sn(CH_3)_4$ |
| $(InAs)_{1-x} Sn_x^{(1)}$ | InAs | $Sn(CH_3)_4$ |
| $(AlSb)_{1-x} Sn_x^{(1)}$ | AlSb | $Sn(CH_3)_4$ |
| $(GaSb)_{1-x} Sn_x^{(1)}$ | GaSb | $Sn(CH_3)_4$ |
| $(InSb)_{1-x} Sn_x^{(1)}$ | InSb | $Sn(CH_3)_4$ |
| $(BN)_x Sn_y Si_z^{(2)}$ | BN | $Sn(CH_3)_4$ & $SiH_4$ |
| $(AlN)_x Sn_y Si_z^{(2)}$ | AlN | $Sn(CH_3)_4$ & $SiH_4$ |
| $(GaN)_x Sn_y Si_z^{(2)}$ | GaN | $Sn(CH_3)_4$ & $SiH_4$ |
| $(InN)_x Sn_y Si_z^{(2)}$ | InN | $Sn(CH_3)_4$ & $SiH_4$ |
| $(BP)_x Sn_y Si_z^{(2)}$ | BP | $Sn(CH_3)_4$ & $SiH_4$ |
| $(AlP)_x Sn_y Si_z^{(2)}$ | AlP | $Sn(CH_3)_4$ & $SiH_4$ |
| $(GaP)_x Sn_y Si_z^{(2)}$ | GaP | $Sn(CH_3)_4$ & $SiH_4$ |
| $(InP)_x Sn_y Si_z^{(2)}$ | InP | $Sn(CH_3)_4$ & $SiH_4$ |
| $(AlAs)_x Sn_y Si_z^{(2)}$ | AlAs | $Sn(CH_3)_4$ & $SiH_4$ |
| $(GaAs)_x Sn_y Si_z^{(2)}$ | GaAs | $Sn(CH_3)_4$ & $SiH_4$ |
| $(AlSb)_x Sn_y Si_z^{(2)}$ | AlSb | $Sn(CH_3)_4$ & $SiH_4$ |
| $(CaSb)_x Sn_y Si_z^{(2)}$ | GaSb | $Sn(CH_3)_4$ & $SiH_4$ |
| $(InSb)_x Sn_y Si_z^{(2)}$ | InSb | $Sn(CH_3)_4$ & $SiH_4$ |
| $(BN)_x Sn_y Ge_z^{(2)}$ | BN | $Sn(CH_3)_4$ & $GeH_4$ |
| $(AlN)_x Sn_y Ge_z^{(2)}$ | AlN | $Sn(CH_3)_4$ & $GeH_4$ |
| $(GaN)_x Sn_y Ge_z^{(2)}$ | GaN | $Sn(CH_3)_4$ & $GeH_4$ |
| $(InN)_x Sn_y Ge_z^{(2)}$ | InN | $Sn(CH_3)_4$ & $GeH_4$ |
| $(BP)_x Sn_y Ge_z^{(2)}$ | BP | $Sn(CH_3)_4$ & $GeH_4$ |
| $(AlP)_x Sn_y Ge_z^{(2)}$ | AlP | $Sn(CH_3)_4$ & $GeH_4$ |
| $(GaP)_x Sn_y Ge_z^{(2)}$ | GaP | $Sn(CH_3)_4$ & $GeH_4$ |
| $(InP)_x Sn_y Ge_z^{(2)}$ | InP | $Sn(CH_3)_4$ & $GeH_4$ |
| $(AlAs)_x Sn_y Ge_z^{(2)}$ | AlAs | $Sn(CH_3)_4$ & $GeH_4$ |
| $(GaAs)_x Sn_y Ge_z^{(2)}$ | GaAs | $Sn(CH_3)_4$ & $GeH_4$ |
| $(AlSb)_x Sn_y Ge_z^{(2)}$ | AlSb | $Sn(CH_3)_4$ & $GeH_4$ |
| $(GaSb)_x Sn_y Ge_z^{(2)}$ | GaSb | $Sn(CH_3)_4$ & $GeH_4$ |
| $(InSb)_x Sn_y Ge_z^{(2)}$ | InSb | $Sn(CH_3)_4$ & $GeH_4$ |
| $(BN)_x Si_y Ge_z^{(2)}$ | BN | $SiH_4$ & $GeH_4$ |
| $(AlN)_x Si_y Ge_z^{(2)}$ | AlN | $SiH_4$ & $GeH_4$ |

TABLE II-continued
EXAMPLES OF NOVEL SOLID SOLUTIONS AND
PREPARATIVE SPUTTER TARGETS AND REACTIVE GASES

| Solid Solution composition | Sputter Target Composition | Reactive Gas Composition |
|---|---|---|
| $(GaN)_x Si_y Ge_z^{(2)}$ | GaN | $SiH_4$ & $GeH_4$ |
| $(InN)_x Si_y Ge_z^{(2)}$ | InN | $SiH_4$ & $GeH_4$ |
| $(BP)_x Si_y Ge_z^{(2)}$ | BP | $SiH_4$ & $GeH_4$ |
| $(AlP)_x Si_y Ge_z^{(2)}$ | AlP | $Si_4$ & $GeH_4$ |
| $(AlSb)_x Si_y Ge_z^{(2)}$ | AlSbS | $SiH_4$ & $GeH_4$ |
| $(InP)_x Si_y Ge_z^{(2)}$ | InP | $SiH_4$ & $GeH_4$ |
| $(AlAs)_x Si_y Ge_z^{(2)}$ | AlAs | $SiH_4$ & $GeH_4$ |
| $(InAs)_x Si_y Ge_z^{(2)}$ | InAs | $SiH_4$ & $GeH_4$ |
| $(InSb)_x Si_y Ge_z^{(2)}$ | InSb | $SiH_4$ & $GeH_4$ |
| $In_y As_x Si_y Ge_z^{(3)}$ | In | $AsH_3$ & $SiH_4$ & $GeH_4$ |
| $In_y As_x Si_y Ge_z^{(3)}$ | Ge | $In(CH_3)_3$ & $AsH_3$ & $SiH_4$ |
| $B_x N_y Si_z^{(2)}$ | Si | $B_2H_6$ & $N_2$ |
| $Al_x N_y Si_z^{(2)}$ | Al | $N_2$ & $SiH_4$ |
| $Ga_x N_y Si_z^{(2)}$ | Si | $Ga(CH_3)_3$ & $N_2$ |
| $In_x N_y Si_z^{(2)}$ | In | $SiH_4$ & $N_2$ |
| $B_x P_y Si_z^{(2)}$ | Si | $B_2H_6$ & $SiH_4$ |
| $Al_x P_y Si_z^{(2)}$ | Al | $PH_3$ & $SiH_4$ |
| $Al_x Sb_y Si_z^{(2)}$ | Al | $SbH_3$ & $SiH_4$ |
| $In_x P_y Si_z^{(2)}$ | In | $PH_3$ & $SiH_4$ |
| $Al_x As_y Si_z^{(2)}$ | Al | $AsH_3$ & $SiH_4$ |
| $In_x As_y Si_z^{(2)}$ | In | $AsH_3$ & $SiH_4$ |
| $B_x H_y Ge_z^{(2)}$ | Ge | $B_2H_6$ & $N_2$ |
| $Al_x N_y Ge_z^{(2)}$ | Al | $N_2$ & $GeH_4$ |
| $Ga_x N_y Ge_z^{(2)}$ | Ga | $N_2$ & $GeH_4$ |
| $In_x N_y Ge_z^{(2)}$ | Ge | $In(CH_3)_3$ & $N_2$ |
| $B_x P_y Ge_z^{(2)}$ | Ge | $B_2H_6$ & $PH_3$ |
| $Al_x P_y Ge_z^{(2)}$ | Ge | $Al(CH_3)_3$ & $PH_3$ |
| $Al_x Sb_y Ge_z^{(2)}$ | Al | $SbH_3$ & $GeH_4$ |
| $In_x P_y Ge_z^{(2)}$ | In | $PH_3$ 6 $GeH_4$ |
| $Al_x As_y Ge_z^{(2)}$ | Al | $AsH_3$ & $GeH_4$ |
| $In_x As_y Ge_z^{(2)}$ | Al | $SbH_3$ & $GeH_4$ |
| $Al_x Sb_y Ge_z^{(2)}$ | Ge | $Al(CH_3)_3$ & $SbH_3$ |
| $In_x Sb_y Si_z^{(2)}$ | In | $SbH_3$ & $SiH_4$ |
| $In_x Sb_y Ge_z^{(2)}$ | Ge | $In(CH_3)_3$ & $SbH_3$ |
| $B_x N_y Sn_z^{(2)}$ | Sn | $B_2H_6$ & $N_2$ |
| $Al_x N_y Sn_z^{(2)}$ | Al | $N_2$ & $Sn(CH_3)_4$ |
| $Ga_x N_y Sn_z^{(2)}$ | Sn | $Ga(CH_3)_3$ & $N_2$ |
| $In_x N_y Sn_z^{(2)}$ | In | $N_2$ & $Sn(CH_3)_4$ |
| $B_x P_y Sn_z^{(2)}$ | B | $PH_3$ & $Sn(CH_3)_4$ |
| $Al_x P_y Sn_z^{(2)}$ | Al | $PH_3$ & $Sn(CH_3)_4$ |
| $Ga_x P_y Sn_z^{(2)}$ | Sn | $Ga(CH_3)_3$ & $PH_3$ |
| $In_x P_y Sn_z^{(2)}$ | In | $PH_3$ & $Sn(CH_3)_4$ |
| $Al_x As_y Sn_z^{(2)}$ | Al | $AsH_3$ & $Sn(CH_3)_4$ |
| $Ga_x As_y Sn_z^{(2)}$ | Ga | $AsH_3$ & $Sn(CH_3)_4$ |
| $In_x As_y Sn_z^{(2)}$ | Sn | $In(CH_3)_3$ & $AsH_3$ |
| $Al_x Sb_y Sn_z^{(2)}$ | Al | $SbH_3$ & $Sn(CH_3)_4$ |
| $Ga_x Sb_y Sn_z^{(2)}$ | Ga | $SbH_3$ & $Sn(CH_3)_4$ |
| $In_x Sb_y Sn_z^{(2)}$ | In | $SbH_3$ & $Sn(CH_3)_4$ |
| $B_y N_x Sn_y Si_z^{(3)}$ | B | $N_2$ & $Sn(CH_{34}$ & $SiH_4$ |
| $Al_y N_x Sn_y Si_z^{(3)}$ | Al | $N_2$ & $Sn(CH_3)_4$ & $SiH_4$ |
| $Ga_y N_x Sn_y Si_z^{(3)}$ | Ca | $N_2$ & $Sn(CH_3)_4$ & $SiH_4$ |
| $In_y N_x Sn_y Si_z^{(3)}$ | In | $N_2$ & $Sn(CH_3)_4$ & $SiH_4$ |
| $B_y P_x Sn_y Si_z^{(3)}$ | B | $PH_3$ & $Sn(CH_3)_4$ & $SiH_4$ |
| $Al_y P_x Sn_y Si_z^{(3)}$ | Al | $PH_3$ & $Sn(CH_3)_4$ & $SiH_4$ |
| $Ga_y P_x Sn_y Si_z^{(3)}$ | Ga | $PH_3$ & $Sn(CH_3)_4$ & $SiH_4$ |
| $In_y P_x Sn_y Si_z^{(3)}$ | In | $PH_3$ & $Sn(CH_3)_4$ & $SiH_4$ |
| $Al_y As_x Sn_y Si_z^{(3)}$ | Al | $AsH_3$ & $Sn(CH_3)_4$ & $SiH_4$ |
| $Ga_y As_x Sn_y Si_z^{(3)}$ | Ga | $AsH_3$ & $Sn(CH_3)_4$ & $SiH_4$ |
| $Al_y Sb_x Sn_y Si_z^{(3)}$ | Sn | $Al(CH_3)_3$ & $SbH_3$ & $SiH_4$ |
| $Ga_y Sb_x Sn_y Si_z^{(3)}$ | Ga | $SbH_3$ & $Sn(CH_3)_4$ & $SiH_4$ |
| $In_y Sb_x Sn_y Si_z$ | Sn | $In(CH_3)_3$ & $SbH_3$ & $SiH_4$ |
| $B_y N_x Sn_y Ge_z$ | B | $N_2$ & $SN(CH_3)_4$ & $GeH_4$ |
| $Al_y N_x Sn_y Ge_z$ | Al | $N_2$ & $Sn(CH_3)_4$ & $GeH_4$ |
| $Ga_y N_x Sn_y Ge_z$ | Ga | $N_2$ & $Sn(CH_3)_4$ & $GeH_4$ |
| $In_y N_x Sn_y Ge_z$ | Sn | $In(CH_3)_3$ & $N_2$ & $GeH_4$ |
| $B_y P_x Sn_y Ge_z$ | Sn | $B_2H_6$ & $PH_3$ & $GeH_4$ |
| $Al_y P_x Sn_y Ge_z$ | Al | $PH_3$ & $Sn(CH_3)_4$ & $GeH_4$ |
| $Ga_y P_x Sn_y Ge_z$ | Sn | $Ga(CH_3)_3$ & $PH_3$ & $GeH_4$ |
| $In_y P_x Sn_y Ge_z$ | Ge | $In(CH_3)_3$ & $PH_3$ & $Sn(CH_3)_4$ |
| $Al_y As_x Sn_y Ge_z$ | Sn | $Al(CH_3)_3$ & $AsH_3$ & $GeH_4$ |
| $Ga_y As_x Sn_y Ge_z$ | Ge | $Ga(CH_3)_3$ & $AsH_3$ & $Sn(CH_3)_4$ |
| $Al_y Sb_x Sn_y Ge_z$ | Sn | $Al(CH_3)_3$ & $SbH_3$ & $GeH_4$ |
| $Ga_y Sb_x Sn_y Ge_z$ | Ge | $Ga(CH_3)_3$ & $SbH_3$ & $Sn(CH_3)_4$ |
| $In_y Sb_x Sn_y Ge_z$ | Sn | $In(CH_3)_3$ & $SbH_3$ & $GeH_4$ |
| $B_y N_x Si_y Ge_z$ | Ge | $B_2H_6$ & $N_2$ & $SiH_4$ |
| $Al_y N_x Si_y Ge_z$ | Al | $N_2$ & $SiH_4$ & $GeH_4$ |
| $Ga_y N_x Si_y Ge_z$ | Ga | $N_2$ & $SiH_4$ & $GeH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $In_y N_x Si_y Ge_z$ | In | $N_2$ & $SiH_4$ & $GeH_4$ |
| $B_y N_x Si_y Ge_z$ | B | $N_2$ & $SiH_4$ & $GeH_4$ |
| $Al_y P_x Si_y Ge_z$ | Ge | $Al(CH_3)_3$ & $PH_3$ & $SiH_4$ |
| $Al_y Sb_x Si_y Ge_z$ | Al | $SbH_3$ & $SiH_4$ & $GeH_4$ |
| $In_y P_x Si_y Ge_z$ | In | $PH_3$ & $SiH_4$ & $GeH_4$ |
| $Al_y As_x Si_y Ge_z$ | Ge | $Al(CH_3)_3$ & $AsH_3$ & $SiH_4$ |
| $Ga_y As_x Si_y Ge_z^{(3)}$ | Ga | $AsH_3$ & $SiH_4$ & $GeH_4$ |
| $Ga_y Sb_x Si_y Ge_z^{(3)}$ | Ga | $Sb(CH_3)_3$ & $SiH_4$ & $Ge(CH_3)_3$ |
| $Ga_y P_x Si_y Ge_z^{(3)}$ | Ga | $PH_3$ & $SiH_4$ & $GeH_4$ |
| $(GaAs)_{1-x}(InAs)_x^{(1)}$ | GaAs or InAs | $In(CH_3)_3$ & $AsH_3$ or $Ga(CH_3)_3$ & $AsH_3$ |
| $(GaSb)_{1-x}(InAs)_x^{(1)}$ | GaSb or InAs | $In(CH_3)_3$ & $AsH_3$ or $Ga(CH_3)_3$ & $SbH_3$ |
| $(GaP)_{1-x}(InAs)_x^{(1)}$ | GaP or InAs | $In(CH_3)_3$ & $AsH_3$ or $Ga(CH_3)_3$ & $PH_3$ |
| $(GaAs)_{1-x}(InSb)_x^{(1)}$ | GaAs or InSb | $In(CH_3)_3$ & $SbH_3$ or $Ga(CH_3)_3$ & $AsH_3$ |
| $(GaSb)_{1-x}(InSb)_x^{(1)}$ | GaSb or InSb | $In(CH_3)_3$ & $SbH_3$ or $Ga(CH_3)_3$ & $SbH_3$ |
| $(GaP)_{1-x}(InSb)_x^{(1)}$ | GaP or InSb | $In(CH_3)_3$ & $SbH_3$ or $Ga(CH_3)_3$ & $PH_3$ |
| $(GaAs)_{1-x}(InP)_x^{(1)}$ | GaAs or InP | $In(CH_3)_3$ & $PH_3$ or $Ga(CH_3)_3$ & $AsH_3$ |
| $(GaSB)_{1-x}(InP)_x^{(1)}$ | GaSb or InP | $In(CH_3)_3$ & $PH_3$ or $Ga(CH_3)_3$ & $SbH_3$ |
| $(GaP)_{1-x}(InP)_x^{(1)}$ | GaP or InP | $In(CH_3)_3$ & $PH_3$ or $Ga(CH_3)_3$ & $PH_3$ |
| $(GaAs)_x(InAs)_y Si_z^{(2)}$ | GaAs or InAs | $In(CH_3)_3$ & $AsH_3$ & $SiH_4$ or $Ga(CH_3)_3$ & $AsH_3$ & $SiH_4$ |
| $(GaAs)_x(InAs)_y Ge_z^{(2)}$ | GaAs or InAs | $In(CH_3)_3$ & $AsH_3$ & $GeH_4$ or $Ga(CH_3)_3$ & $AsH_3$ & $GeH_4$ |
| $(GaSb)_x(InAs)_y Si_z^{(2)}$ | GaSb or InAs | $In(CH_3)_3$ & $AsH_3$ & $SiH_4$ or $Ga(CH_3)_3$ & $SbH_3$ & $SiH_4$ |
| $(GaSb)_x(InAs)_y Ge_z^{(2)}$ | GaSb or InAs | $In(CH_3)_3$ & $AsH_3$ & $GeH_4$ or $Ga(CH_3)_3$ & $SbH_3$ & $GeH_4$ |
| $(GaP)_x(InAs)_y Si_z^{(2)}$ | GaP or InAs | $In(CH_3)_3$ & $AsH_3$ & $SiH_4$ or $Ga(CH_3)_3$ & $PH_3$ 6 $SiH_4$ |
| $(GaP)_x(InAs)_y Ge_z^{(2)}$ | GaP or InAs | $In(CH_3)_3$ & $AsH_3$ & $GeH_4$ or $Ga(CH_3)_3$ & $PH_3$ & $GeH_4$ |
| $(GaAs)_v(InAs)_x Si_y Ge_z^{(3)}$ | GaAs or InAs | $In(CH_3)_3$ & $AsH_3$ & $SiH_4$ & $GeH_4$ or $Ga(CH_3)_3$ & $AsH_3$ & $SiH_4$ & $GeH_4$ |
| $(GaSb)_v(InAs)_x Si_y Ge_z^{(3)}$ | GaSb or InAs | $In(CH_3)_3$ & $AsH_3$ & $SiH_4$ & $GeH_4$ or $Ga(CH_3)_3$ & $AsH_3$ & $SiH_4$ & $GeH_4$ |
| $(GaP)_v(InAs)_x Si_y Ge_z^{(3)}$ | GaP or InAs | $In(CH_3)_3$ & $AsH_3$ & $SiH_4$ & $GeH_4$ or $Ga(CH_3)_3$ & $PH_3$ & $SiH_4$ & $GeH_4$ |
| $(GaAs)_x(InSb)_y Si_z^{(2)}$ | GaAs or InSb | $In(CH_3)_3$ & $SbH_3$ & $SiH_4$ or $Ga(CH_3)_3$ & $AsH_3$ & $SiH_4$ |
| $(GaAs)_x(InSb)_y Ge_z^{(2)}$ | GaAs or InSb | $In(CH_3)_3$ & $SbH_3$ & $GeH_4$ or $Ga(CH_3)_3$ & $AsH_3$ & $GeH_4$ |
| $(GaSb)_x(InSb)_y Si_z^{(2)}$ | GaSb or InSb | $In(CH_3)_3$ & $SbH_3$ & $SiH_4$ or $Ga(CH_3)_3$ & $SbH_3$ & $SiH_4$ |
| $(GaSb)_x(InSb)_y Ge_z^{(2)}$ | GaSb or InSb | $In(CH_3)_3$ & $SbH_3$ & $GeH_4$ or $Ga(CH_3)_3$ & $SbH_3$ & $GeH_4$ |
| $(GaP)_x(InSb)_y Si_z^{(2)}$ | GaP or InSb | $In(CH_3)_3$ & $SbH_3$ & $SiH_4$ or $Ga(CH_3)_3$ & $PH_3$ & $SiH_4$ |
| $(GaP)_x(InSb)_y Ge_z^{(2)}$ | GaP or InSb | $In(CH_3)_3$ & $SbH_3$ & $GeH_4$ or $Ga(CH_3)_3$ & $PH_3$ & $GeH_4$ |
| $(GaAs)_v(InSb)_x Si_y Ge_z^{(3)}$ | GaAs or InSb | $In(CH_3)_3$ & $SbH_3$ & $SiH_4$ & $GeH_4$ or $Ga(CH_3)_3$ & $AsH_3$ & $SiH_4$ & $GeH_4$ |
| $(GaSb)_v(InSb)_x Si_y Ge_z^{(3)}$ | GaSb or InSb | $In(CH_3)_3$ & $SbH_3$ & $SiH_4$ & $GeH_4$ or $Ga(CH_3)_3$ & $SbH_3$ & $SiH_4$ & $GeH_4$ |
| $(GaP)_v(InSb)_x Si_y Ge_z^{(3)}$ | GaP or InSb | $In(CH_3)_3$ & $SbH_3$ & $SiH_4$ & $GeH_4$ or $Ga(CH_3)_3$ & $PH_3$ & $SiH_4$ & $GeH_4$ |
| $(AlSb)_x(BP)_y Si_z^{(2)}$ | AlSb or BP | $B_2H_6$ & $PH_3$ & $SiH_4$ or $Al(CH_3)_3$ & $SbH_3$ & $SiH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaAs)_x(InP)_y Si_z^{(2)}$ | GaAs or InP | $In(CH_3)_3$ & $PH_3$ & $SiH_4$ or $Ga(CH_3)_3$ & $AsH_3$ & $SiH_4$ |
| $(AlSb)_x(AlAs)_y Si_z^{(2)}$ | AlSb or AlAs | $Al(CH_3)_3$ & $AsH_3$ & $SiH_4$ or $Al(CH_3)_3$ & $SbH_3$ & $SiH_4$ |
| $(GaAs)_x(InP)_y Ge_z^{(2)}$ | GaAs or InP | $In(CH_3)_3$ & $PH_3$ & $GeH_4$ or $Ga(CH_3)_3$ & $AsH_3$ & $GeH_4$ |
| $(AlN)_x(GaN)_y Ge_z^{(2)}$ | AlN or GaN | $Ga(CH_3)_3$ & $N_2$ & $GeH_4$ or $Al(CH_3)_3$ & $N_2$ & $GeH_4$ |
| $(GaSb)_x(InP)_y Si_z^{(2)}$ | GaSb or InP | $In(CH_3)_3$ & $PH_3$ & $SiH_4$ or $Ga(CH_3)_3$ & $SbH_4$ & $SiH_4$ |
| $(BP)_x(InAs)_y Si_z^{(2)}$ | BP or InAs | $In(CH_3)_3$ & $AsH_3$ & $SiH_4$ or $B_2H_6$ & $PH_3$ & $SiH_4$ |
| $(GaSb)_x(InP)_y Ge_z^{(2)}$ | GaSb or InP | $In(CH_3)_3$ & $PH_3$ & $GeH_4$ or $Ga(CH_3)_3$ & $SbH_3$ & $GeH_4$ |
| $(BN)_x(InN)_y Ge_z^{(2)}$ | BN or InN | $In(CH_3)_3$ & $N_2$ & $GeH_4$ or $B_2H_6$ & $N_2$ & $GeH_4$ |
| $(GaP)_x(InP)_y Si_z^{(2)}$ | GaP or InP | $In(CH_3)_3$ & $PH_3$ & $SiH_4$ or $Ga(CH_3)_3$ & $PH_3$ & $SiH_4$ |
| $(AlAs)_x(AlP)_y Si_z^{(2)}$ | AlAs or AlP | $Al(CH_3)_3$ & $PH_3$ & $Ge_4$ or $Cl(CH_3)_3$ & $AsH_3$ & $SiH_4$ |
| $(GaP)_x(InP)_y Ge_z^{(2)}$ | GaP or InP | $In(CH_3)_3$ & $PH_3$ & $GeH_4$ or $Ga(CH_3)_3$ & $PH_3$ & $GeH_4$ |
| $(AlSb)_x(InAs)_y Si_z^{(2)}$ | AlSb or InAs | $In(CH_3)_3$ & $AsH_3$ & $SiH_4$ or $Al(CH_3)_3$ & $SbH_3$ & $SiH_4$ |
| $(GaAs)_v(InP)_x Si_y Ge_z^{(3)}$ | GaAs or InP | $In(CH_3)_3$ & $PH_3$ & $SiH_4$ & $GeH_4$ or $Ga(CH_3)_3$ & $AsH_3$ & $SiH_4$ & $GeH_4$ |
| $(BN)_v(InN)_x Si_y Ge_z^{(3)}$ | BN or InN | $In(CH_3)_3$ & $PH_3$ & $GeH_4$ & $SiH_4$ or $B_2H_6$ & $N_2$ & $SiH_4$ & $GeH_4$ |
| $(GaSb)_v(InP)_x Si_y Ge_z^{(3)}$ | GaAs or InP | $In(CH_3)_3$ & $PH_3$ & $SiH_4$ & $GeH_4$ or $Ga(CH_3)_3$ & $SbH_3$ & $SiH_4$ & $GeH_4$ |
| $(GaN)_v(AlN)_x Si_y Ge_z^{(3)}$ | GaN or AlN | $Al(CH_3)_3$ & $N_2$ & $SiH_4$ & $GeH_4$ or $Ga(CH_3)_3$ & $N_2$ & $SiH_4$ & $GeH_4$ |
| $(GaP)_v(InP)_x Si_y Ge_z^{(3)}$ | GaP or InP | $In(CH_3)_3$ & $PH_3$ & $SiH_4$ & $GeH_4$ or $Ga(CH_3)_3$ & $PH_3$ & $SiH_4$ & $GeH_4$ |
| $(GaAs)_{1-x}(AlAs)_x^{(1)}$ | AlAs | $Ga(CH_3)_3$ & $AsH_3$ |
| $(GaSb)_{1-x}(AlAs)_x^{(1)}$ | AlAs | $Ga(CH_3)_3$ & $SbH_3$ |
| $(GaP)_{1-x}(AlAs)_x^{(1)}$ | AlAs | $Ga(CH_3)_3$ & $PH_3$ |
| $(GaAs)_{1-x}(AlSb)_x^{(1)}$ | AlSb | $Ga(CH_3)_3$ & $AsH_3$ |
| $(GaSb)_{1-x}(AlSb)_x^{(1)}$ | AlSb | $Ga(CH_3)_3$ & $SbH_3$ |
| $(GaP)_{1-x}(AlSb)_x^{(1)}$ | AlSb | $Ga(CH_3)_3$ & $PH_3$ |
| $(GaAs)_{1-x}(AlP)_x^{(1)}$ | AlP | $Ga(CH_3)_3$ & $AsH_3$ |
| $(GaSb)_{1-x}(AlP)_x^{(1)}$ | AlP | $Ga(CH_3)_3$ & $SbH_3$ |
| $(GaP)_{1-x}(AlP)_x^{(1)}$ | AlP | $Ga(CH_3)_3$ & $PH_3$ |
| $(GaAs)_x(AlAs)_y Si_z^{(2)}$ | AlAs | $Ga(CH_3)_3$ & $AsH_3$ & $SiH_4$ |
| $(GaAs)_x(AlAs)_y Ge_z^{(2)}$ | AlAs | $Ga(CH_3)_3$ & $AsH_3$ & $GeH_4$ |
| $(GaSb)_x(AlAs)_y Si_z^{(2)}$ | AlAs | $Ga(CH_3)_3$ & $SbH_3$ & $SiH_4$ |
| $(GaSb)_x(AlAs)_y Ge_z^{(2)}$ | AlAs | $Ga(CH_3)_3$ & $SbH_3$ & $GeH_4$ |
| $(GaP)_x(AlAs)_y Si_z^{(2)}$ | AlAs | $Ga(CH_3)_3$ & $PH_3$ & $SiH_4$ |
| $(GaP)_x(AlAs)_y Ge_z^{(2)}$ | AlAs | $Ca(CH_3)_3$ & $PH_3$ & $GeH_4$ |
| $(GaAs)_v(AlAs)_x Si_y Ge_z^{(3)}$ | AlAs | $Ga(CH_3)_3$ & $AsH_3$ & $SiH_4$ & $GeH_4$ |
| $(GaSb)_v(AlAs)_x Si_y Ge_z^{(3)}$ | AlAs | $Ga(CH_3)$ & $SbH_3$ & $SiH_4$ & $GeH_4$ |
| $(GaP)_v(AlAs)_x Si_y Ge_z^{(3)}$ | AlAs | $Ga(CH_3)_3$ & $PH_3$ & $SiH_4$ & $GeH_4$ |
| $(GaAs)_x(AlSb)_y Si_z^{(2)}$ | AlSb | $Ga(CH_3)_3$ & $AsH_3$ & $SiH_4$ |
| $(GaAs)_x(AlSb)_y Ge_z^{(2)}$ | AlSb | $Ga(CH_3)_3$ & $AsH_3$ & $GeH_4$ |
| $(GaSb)_x(AlSb)_y Si_z^{(2)}$ | AlSb | $Ga(CH_3)_3$ & $SbH_3$ & $SiH_4$ |
| $(GaSb)_x(AlSb)_y Ge_z^{(2)}$ | AlSb | $Ga(CH_3)_3$ & $SbH_3$ & $GeH_4$ |
| $(GaP)_x(AlSb)_y Si_z^{(2)}$ | AlSb | $Ga(CH_3)_3$ & $PH_3$ & $SiH_4$ |
| $(GaP)_x(AlSb)_y Ge_z^{(2)}$ | AlSb | $Ga(CH_3)_3$ & $PH_3$ & $GeH_4$ |
| $(GaAs)_v(AlSb)_x Si_y Ge_z^{(3)}$ | AlSb | $Ga(CH_3)_3$ & $AsH_3$ & $SiH_4$ & $GeH_4$ |
| $(GaSb)_v(AlSb)_x Si_y Ge_z^{(3)}$ | AlSb | $Ga(CH_3)_3$ & $SbH_3$ & $SiH_4$ & $GeH_4$ |
| $(GaP)_v(AlSb)_x Si_y Ge_z^{(3)}$ | AlSb | $Ga(CH_3)_3$ & $PH_3$ & $SiH_4$ & $GeH_4$ |
| $(GaAs)_x(AlP)_y Si_z^{(2)}$ | AlP | $Ga(CH_3)_3$ & $AsH_3$ & $SiH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaAs)_x (AlP)_y Ge_z^{(2)}$ | AlP | $Ga(CH_3)_3$ & $AsH_3$ & $GeH_4$ |
| $(GaSb)_x (AlP)_y Si_z^{(2)}$ | AlP | $Ga(CH_3)_3$ & $SbH_3$ & $SiH_4$ |
| $(GaSb)_x (AlP)_y Ga_z^{(2)}$ | AlP | $Ga(CH_3)_3$ & $SbH_3$ & $GeH_4$ |
| $(GaP)_x (AlP)_y Si_z^{(2)}$ | AlP | $Ga(CH_3)_3$ & $PH_3$ & $SiH_4$ |
| $(GaP)_x (AlP)_y Ge_z^{(2)}$ | AlP | $Ga(CH_3)_3$ & $PH_3$ & $GeH_4$ |
| $(GaAs)_v(AlP)_x Si_y Ge_z^{(3)}$ | AlP | $Ga(CH_3)_3$ & $AsH_3$ & $SiH_4$ & $GeH_4$ |
| $(GaSb)_v(AlP)_x Si_y Ge_z^{(3)}$ | AlP | $Ga(CH_3)_3$ & $SbH_3$ & $SiH_4$ & $GeH_4$ |
| $(GaP)_v(AlP)_x Si_y Ge_z^{(3)}$ | AlP | $Ga(CH_3)_3$ & $PH_3$ & $SiH_4$ & $GeH_4$ |
| $(AlAs)_{1-x} Si_x^{(1)}$ | AlAs | $SiH_4$ or $SiCl_4$ |
| $(AlAs)_{1-x} Ge_x^{(1)}$ | AlAs | $GeH_4$ or $Ge(CH_3)_4$ |
| $(AlSb)_{1-x} Si_x^{(1)}$ | AlSb | $SiH_4$ or $SiCl_4$ |
| $(AlSb)_{1-x} Ge_x^{(1)}$ | AlSb | $GeH_4$ or $Ge(CH_3)_4$ |
| $(AlP)_{1-x} Si_x^{(1)}$ | AlP | $SiH_4$ or $Ge(CH_3)_4$ |
| $(AlP)_{1-x} Ge_x^{(1)}$ | AlP | $GeH_4$ or $Ge(CH_3)_4$ |
| $Al_x As_y Si_z^{(2)}$ | Al | $AsH_3$ & $SiH_4$ |
| $Al_x As_y Ge_z^{(2)}$ | Al | $AsH_3$ & $GeH_4$ |
| $Al_x Sb_y Si_z^{(2)}$ | Al | $SbH_3$ & $SiH_4$ |
| $Al_x Sb_y Ge_z^{(2)}$ | Al | $SbH_3$ & $GeH_4$ |
| $Al_x P_y Si_z^{(2)}$ | Al | $PH_3$ & $SiH_4$ |
| $Al_x P_y Ge_z^{(2)}$ | Al | $PH_3$ & $GeH_4$ |
| $Al_y As_x Si_y Ge_z^{(3)}$ | Al | $AsH_3$ & $SiH_4$ & $GeH_4$ |
| $Al_y Sb_x Si_y Ge_z^{(3)}$ | Al | $SbH_3$ & $SiH_4$ & $GeH_4$ |
| $Al_y P_x Si_y Ge_z^{(2)}$ | Al | $PH_3$ & $SiH_4$ & $GeH_4$ |
| $(AlAs)_x Si_y Ge_z$ | AlAs | $SiH_4$ & $GeH_4$ |
| $(AlSb)_x Si_y Ge_z^{(2)}$ | AlSb | $SiH_4$ & $GeH_4$ |
| $(AlP)_x Si_y Ge_z^{(2)}$ | AlP | $SiH_4$ & $GeH_4$ |
| $(AlAs)_{1-x} (InAs)_x^{(1)}$ | AlAs | $AsH_3$ & $In(CH_3)_3$ |
| $(AlSb)_{1-x} (InAs)_x^{(1)}$ | AlSb | $AsH_3$ & $In(CH_3)_3$ |
| $(AlP)_{1-x} (InAs)_x^{(1)}$ | AlP | $AsH_3$ & $In(CH_3)_3$ |
| $(AlAs)_{1-x} (InSb)_x^{(1)}$ | AlAs | $SbH_3$ & $In(CH_3)_3$ |
| $(AlSb)_{1-x} (InSb)_x^{(1)}$ | AlSb | $SbH_3$ & $In(CH_3)_3$ |
| $(AlP)_{1-x} (InSb)_x^{(1)}$ | AlP | $SbH_3$ & $In(CH_3)_3$ |
| $(AlAs)_{1-x} (InP)_x^{(1)}$ | AlAs | $PH_3$ & $In(CH_3)_3$ |
| $(AlSb)_{1-x} (InP)_x^{(1)}$ | AlSb | $PH_3$ & $In(CH_3)_3$ |
| $(AlP)_{1-x} (InP)_x^{(1)}$ | AlP | $PH_3$ & $In(CH_3)_3$ |
| $(AlAs)_x (InAs)_y Si_z^{(2)}$ | AlAs | $AsH_3$ & $In(CH_3)_3$ & $SiH_4$ |
| $(AlAs)_x (InAs)_y Ge_z^{(2)}$ | AlAs | $AsH_3$ & $In(CH_3)_3$ & $GeH_4$ |
| $(AlSb)_x (InAs)_y Si_z^{(2)}$ | AlSb | $AsH_3$ & $In(CH_3)_3$ & $SiH_4$ |
| $(AlSb)_x (InAs)_y Ge_z^{(2)}$ | AlSb | $AsH_3$ & $In(CH_3)_3$ & $GeH_4$ |
| $(AlP)_x (InAs)_y Si_z^{(2)}$ | AlP | $AsH_3$ & $In(CH_3)_3$ & $GeH_4$ |
| $(AlP)_x (InAs)_y Ge_z^{(2)}$ | AlP | $AsH_3$ & $In(CH_3)_3$ & $GeH_4$ |
| $(AlAs)_v(InAs)_x Si_y Ge_z^{(3)}$ | AlAs | $AsH_3$ & $In(CH_3)_3$ & $SiH_4$ & $GeH_4$ |
| $(AlSb)_v(InAs)_x Si_y Ge_z^{(3)}$ | AlSb | $AsH_3$ & $In(CH_3)_3$ & $SiH_4$ & $Ge(CH_3)_4$ |
| $(AlP)_v(InAs)_x Si_y Ge_z^{(3)}$ | AlP | $AsH_3$ & $In(CH_3)_3$ & $SiH_4$ & $Ge(CH_3)_4$ |
| $(AlAs)_x (InSb)_y Si_z^{(2)}$ | AlAs | $In(CH_3)_3$ & $Sb(CH_3)_3$ & $SiH_4$ |
| $(AlAs)_x (InSb)_y Ge_z^{(2)}$ | AlAs | $In(CH_3)_3$ & $Sb(CH_3)_3$ & $GeH_4$ |
| $(AlSb)_x (InSb)_y Si_z^{(2)}$ | AlSb | $In(CH_3)_3$ & $Sb(CH_3)_3$ & $SiH_4$ |
| $(AlSb)_x (InSb)_y Ge_z^{(2)}$ | AlSb | $In(CH_3)_3$ & $Sb(CH_3)_3$ & $GeH_4$ |
| $(AlP)_x (InSb)_y Si_z^{(2)}$ | AlP | $In(CH_3)_3$ & $Sb(CH_3)_3$ & $SiH_4$ |
| $(AlP)_x (InSb)_y Ge_z^{(2)}$ | AlP | $In(CH_3)_3$ & $Sb(CH_3)_3$ & $GeH_4$ |
| $(AlAs)_v(InSb)_x Si_y Ge_z^{(3)}$ | AlAs | $In(CH_3)_3$ & $Sb(CH_3)_3$ & $SiH_4$ & $GeH_4$ |
| $(AlSb)_v(InSb)_x Si_y Ge_z^{(3)}$ | AlSb | $In(CH_3)_3$ & $Sb(CH_3)_3$ & $SiH_4$ & $GeH_4$ |
| $(AlP)_v(InSb)_x Si_y Ge_z^{(3)}$ | AlP | $In(CH_3)_3$ & $Sb(CH_3)_3$ & $SiH_4$ & $GeH_4$ |
| $(AlAs)_x (InP)_y Si_z^{(2)}$ | AlAs | $In(CH_3)_3$ & $PH_3$ & $SiH_4$ |
| $(AlAs)_x (InP)_y Ge_z^{(2)}$ | AlAs | $In(CH_3)_3$ & $PH_3$ & $GeH_4$ |
| $(AlSb)_x (InP)_y Si_z^{(2)}$ | AlSb | $In(CH_3)_3$ & $PH_3$ & $SiH_4$ |
| $(AlSb)_x (InP)_y Ge_z^{(2)}$ | AlSb | $In(CH_3)_3$ & $PH_3$ & $GeH_4$ |
| $(AlP)_x (InP)_y Si_z^{(2)}$ | AlP | $In(CH_3)_3$ & $PH_3$ & $SiH_4$ |
| $(AlP)_x (InP)_y Ge_z^{(2)}$ | AlP | $In(CH_3)_3$ & $PH_3$ & $GeH_4$ |
| $(AlAs)_v(InP)_x Si_y Ge_z^{(3)}$ | AlAs | $In(CH_3)_3$ & $PH_3$ & $SiH_4$ & $GeH_4$ |
| $(AlSb)_v(InP)_x Si_y Ge_z^{(3)}$ | AlSb | $In(CH_3)_3$ & $PH_3$ & $SiH_4$ & $GeH_4$ |
| $(AlP)_v(InP)_x Si_y Ge_z^{(3)}$ | AlP | $In(CH_3)_3$ & $PH_3$ & $SiH_4$ & $GeH_4$ |
| $In_x As_y Si_z^{(2)}$ | In | $AsH_3$ & $SiH_4$ |
| $In_x As_y Ge_z^{(2)}$ | In | $AsH_3$ & $GeH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $In_x Sb_y Si_z^{(2)}$ | In | $SbH_3$ & $SiH_4$ |
| $In_x Sb_y Ge_z^{(2)}$ | In | $SbH_3$ & $GeH_4$ |
| $In_x P_x Si_z^{(2)}$ | In | $PH_3$ & $SiH_4$ |
| $In_x P_x Ge_z^{(2)}$ | In | $PH_3$ & $GeH_4$ |
| $In_y As_x Si_y Ge_z^{(3)}$ | In | $AsH_3$ & $SiH_4$ & $GeH_4$ |
| $In_y Sb_x Si_y Ge_z^{(3)}$ | In | $SbH_3$ & $SiH_4$ & $GeH_4$ |
| $In_y P_x Si_y Ge_z^{(3)}$ | In | $PH_3$ & $SiH_4$ & $GeH_4$ |
| $(InAs)_{1-x} Si_x^{(1)}$ | InAs | $SiH_4$ or $SiCl_4$ |
| $(InAs)_{1-x} Ge_x^{(1)}$ | InAs | $GeH_4$ or $Ge(CH_3)_4$ |
| $(InSb)_{1-x} Si_x^{(1)}$ | InSb | $SiH_4$ or $SiCl_4$ |
| $(InSb)_{1-x} Ge_x^{(1)}$ | InSb | $GeH_4$ or $Ge(CH_3)_4$ |
| $(InP)_{1-x} Si_x^{(1)}$ | InP | $SiH_4$ or $SiCl_4$ |
| $(InP)_{1-x} Ge_x^{(1)}$ | InP | $GeH_4$ or $Ge(CH_3)_4$ |
| $(InAs)_x Si_y Ge_z^{(2)}$ | InAs | $SiH_4$ & $GeH_4$ |
| $(InSb)_x Si_y Ge_z^{(2)}$ | InSb | $SiH_4$ & $GeH_4$ |
| $(InP)_x Si_y Ge_z^{(2)}$ | InP | $SiH_4$ & $GeH_4$ |
| $(GaAs)_v Ga_x As_y Si_z^{(3)}$ | GaAs or Ga | $Ga(CH_3)_3$ & $AsH_3$ & $SiH_4$ |
| $(GaSb)_v Ga_x As_y Si_z^{(3)}$ | GaSb or Ga | $Ga(CH_3)_3$ & $AsH_3$ & $SiH_4$ or $Ga(CH_3)_3$ & $SbH_3$ & $AsH_3$ & $SiH_4$ |
| $(GaP)_v Ga_x As_y Si_z^{(3)}$ | GaP or Ga | $Ga(CH_3)_3$ & $AsH_3$ & $SiH_4$ or $Ga(CH_3)_3$ & $PH_3$ & $AsH_3$ & $SiH_4$ |
| $(AlAs)_v Ga_x As_y Si_z^{(3)}$ | AlAs | $Ga(CH_3)_3$ & $AsH_3$ & $SiH_4$ |
| $(AlSb)_v Ga_x As_y Si_z^{(3)}$ | AlSb | $Ga(CH_3)_3$ & $AsH_3$ & $SiH_4$ |
| $(AlP)_v Ga_x As_y Si_z^{(3)}$ | AlP | $Ga(CH_3)_3$ & $AsH_3$ & $SiH_4$ |
| $(InAs)_v Ga_x As_y Si_z^{(3)}$ | InAs or Ga | $Ga(CH_3)_3$ & $AsH_3$ & $SiH_4$ or $In(CH_3)_3$ & $AsH_3$ & $SiH_4$ |
| $(InSb)_v Ga_x As_y Si_z^{(3)}$ | InSb or Ga | $Ga(CH_3)_3$ & $AsH_3$ & $SiH_4$ or $In(CH_3)_3$ & $SbH_3$ & $AsH_3$ & $SiH_4$ |
| $(InP)_v Ga_x As_y Si_z^{(3)}$ | InP or Ga | $Ga(CH_3)_3$ & $AsH_3$ & $SiH_4$ or $In(CH_3)_3$ & $PH_3$ & $AsH_3$ & $SiH_4$ |
| $(GaAs)_v Ga_x As_y Ge_z^{(3)}$ | GaAs or Ga | $Ga(CH_3)_3$ & $AsH_3$ & $GeH_4$ or $Ga(CH_3)_3$ & $AsH_3$ & $GeH_4$ |
| $(GaSb)_v Ga_x As_y Ge_z^{(3)}$ | GaSb or Ga | $Ga(CH_3)_3$ & $AsH_3$ & $GeH_4$ or $Ga(CH_3)_3$ & $SbH_3$ & $AsH_3$ & $GeH_4$ |
| $(GaP)_v Ga_x As_y Ge_z^{(3)}$ | G P or Ga | $Ga(CH_3)_3$ & $AsH_3$ & $GeH_4$ or $Ga(CH_3)_3$ & $PH_3$ & $AsH_3$ & $GeH_4$ |
| $(AlAs)_v Ga_x As_y Ge_z^{(3)}$ | AlAs | $Ga(CH_3)_3$ & $AsH_3$ & $GeH_4$ |
| $(AlSb)_v Ga_x As_y Ge_z^{(3)}$ | AlSb | $Ga(CH_3)_3$ & $AsH_3$ & $GeH_4$ |
| $(AlP)_v Ga_x As_y Ge_z^{(3)}$ | AlP | $Ga(CH_3)_3$ & $AsH_3$ & $GeH_4$ |
| $(InAs)_v Ga_x As_y Ge_z^{(3)}$ | InSb or Ga | $Ga(CH_3)_3$ & $AsH_3$ & $GeH_4$ or $In(CH_3)_3$ & $AsH_3$ & $GeH_4$ |
| $(InSb)_v Ga_x As_y Ge_z^{(3)}$ | InSb or Ga | $Ga(CH_3)_3$ & $AsH_3$ & $GeH_4$ or $In(CH_3)_3$ & $SbH_3$ & $AsH_3$ & $GeH_4$ |
| $(InP)_v Ga_x As_y Ge_z^{(3)}$ | InP or Ga | $Ga(CH_3)_3$ & $AsH_3$ & $GeH_4$ or $In(CH_3)_3$ & $PH_3$ & $AsH_3$ & $GeH_4$ |
| $(GaAs)_u Ga_v As_x Si_y Ge_z^{(4)}$ | GaAs or Ga | $Ga(CH_3)_3$ & $AsH_3$ & $SiH_4$ & $GeH_4$ or $Ga(CH_3)_3$ & $AsH_3$ & $SiH_4$ & $GeH_4$ |
| $(GaSb)_u Ga_v As_x Si_y Ge_z^{(4)}$ | GaSb or Ga | $Ga(CH_3)_3$ & $AsH_3$ & $SiH_4$ & $GeH_4$ or $Ga(CH_3)_3$ & $SbH_3$ & $AsH_3$ & $SiH_4$ & $GeH_4$ |
| $(GaP)_u Ga_v As_x Si_y Ge_z^{(4)}$ | GaP or Ga | $Ga(CH_3)_3$ & $AsH_3$ & $SiH_4$ & $GeH_4$ or $Ga(CH_3)_3$ & $PH_3$ & $AsH_3$ & $SiH_4$ & $GeH_4$ |
| $(AlAs)_u Ga_v As_x Si_y Ge_z^{(4)}$ | AlAs | $Ga(CH_3)_3$ & $AsH_3$ & $SiH_4$ & $GeH_4$ |
| $(AlSb)_u Ga_v As_x Si_y Ge_z^{(4)}$ | AlSb | $Ga(CH_3)_3$ & $AsH_3$ & $SiH_4$ & $GeH_4$ |
| $(AlP)_u Ga_v As_x Si_y Ge_z^{(4)}$ | AlP | $Ga(CH_3)_3$ & $AsH_3$ & $SiH_4$ & $GeH_4$ |
| $(InAs)_u Ga_v As_x Si_y Ge_z^{(4)}$ | InAs | $Ga(CH_3)_3$ & $AsH_3$ & $SiH_4$ & $GeH_4$ |
| $(InSb)_u Ga_v As_x Si_y Ge_z^{(4)}$ | InSb | $Ga(CH_3)_3$ & $AsH_3$ & $SiH_4$ & $GeH_4$ |
| $(InP)_u Ga_v As_x Si_y Ge_z^{(4)}$ | InP | $Ga(CH_3)_3$ & $AsH_3$ & $SiH_4$ & $GeH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaAs)_v Al_x As_y Si_z^{(3)}$ | GaAs | $Al(CH_3)_3$ & $AsH_3$ & $SiH_4$ |
| $(GaSb)_v Al_x As_y Si_z^{(3)}$ | GaSb | $Al(CH_3)_3$ & $AsH_3$ & $SiH_4$ |
| $(GaP)_v Al_x As_y Si_z^{(3)}$ | GaP | $Al(CH_3)_3$ & $AsH_3$ & $SiH_4$ |
| $(AlAs)_v Al_x As_y Si_z^{(3)}$ | AlAs | $Al(CH_3)_3$ & $AsH_3$ & $SiH_4$ |
| $(AlSb)_v Al_x As_y Si_z^{(3)}$ | AlSb | $Al(CH_3)_3$ & $AsH_3$ & $SiH_4$ |
| $(AlP)_v Al_x As_y Si_z^{(3)}$ | AlP | $Al(CH_3)_3$ & $AsH_3$ & $SiH_4$ |
| $(InAs)_v Al_x As_y Si_z^{(3)}$ | InAs | $Al(CH_3)_3$ & $AsH_3$ & $SiH_4$ |
| $(InSb)_v Al_x As_y Si_z^{(3)}$ | InSb | $Al(CH_3)_3$ & $AsH_3$ & $SiH_4$ |
| $(InP)_v Al_x As_y Si_z^{(3)}$ | InP | $Al(CH_3)_3$ & $AsH_3$ & $SiH_4$ |
| $(GaAs)_v Al_x As_y Ge_z^{(3)}$ | GaAs | $Al(CH_3)_3$ & $AsH_3$ & $SiH_4$ |
| $(GaSb)_v Al_x As_y Ge_z^{(3)}$ | GaSb | $Al(CH_3)_3$ & $AsH_3$ & $SiH_4$ |
| $(GaP)_v Al_x As_y Ge_z^{(3)}$ | GaP | $Al(CH_3)_3$ & $AsH_3$ & $SiH_4$ |
| $(AlAs)_v Al_x As_y Ge_z^{(3)}$ | AlAs | $Al(CH_3)_3$ & $AsH_3$ & $SiH_4$ |
| $(AlSb)_v Al_x As_y Ge_z^{(3)}$ | AlSb | $Al(CH_3)_3$ & $AsH_3$ & $SiH_4$ |
| $(AlP)_v Al_x As_y Ge_z^{(3)}$ | AlP | $Al(CH_3)_3$ & $AsH_3$ & $SiH_4$ |
| $(InAs)_v Al_x As_y Ge_z^{(3)}$ | InAs | $Al(CH_3)_3$ & $AsH_3$ & $GeH_4$ |
| $(InSb)_v Al_x As_y Ge_z^{(3)}$ | InSb | $Al(CH_3)_3$ & $AsH_3$ & $GeH_4$ |
| $(InP)_v Al_x As_y Ge_z^{(3)}$ | InP | $Al(CH_3)_3$ & $AsH_3$ & $GeH_4$ |
| $(GaAs)_u Al_v As_x Si_y Ge_z^{(4)}$ | GaAs | $Al(CH_3)_3$ & $AsH_3$ & $SiH_4$ & $GeH_4$ |
| $(GaSb)_u Al_v As_x Si_y Ge_z^{(4)}$ | GaSb | $Al(CH_3)_3$ & $AsH_3$ & $SiH_4$ & $GeH_4$ |
| $(GaP)_u Al_v As_x Si_y Ge_z^{(4)}$ | GaP | $Al(CH_3)_3$ & $AsH_3$ & $SiH_4$ & $GeH_4$ |
| $(AlAs)_u Al_v As_x Si_y Ge_z^{(4)}$ | AlAs | $Al(CH_3)_3$ & $AsH_3$ & $SiH_4$ & $GeH_4$ |
| $(AlSb)_u Al_v As_x Si_y Ge_z^{(4)}$ | AlSb | $Al(CH_3)_3$ & $AsH_3$ & $SiH_4$ & $GeH_4$ |
| $(AlP)_u Al_v As_x Si_y Ge_z^{(4)}$ | AlP | $Al(CH_3)_3$ & $AsH_3$ & $SiH_4$ & $GeH_4$ |
| $(InAs)_u Al_v As_x Si_y Ge_z^{(4)}$ | InAs | $Al(CH_3)_3$ & $AsH_3$ & $SiH_4$ & $GeH_4$ |
| $(InSb)_u Al_v As_x Si_y Ge_z^{(4)}$ | InSb | $Al(CH_3)_3$ & $AsH_3$ & $SiH_4$ & $GeH_4$ |
| $(InP)_u Al_v As_x Si_y Ge_z^{(4)}$ | InP | $Al(CH_3)_3$ & $AsH_3$ & $SiH_4$ & $GeH_4$ |
| $(GaAs)_v In_x As_y Si_z^{(3)}$ | GaAs | $In(CH_3)_3$ & $AsH_3$ & $SiH_4$ |
| $(GaSb)_v In_x As_y Si_z^{(3)}$ | GaSb | $In(CH_3)_3$ & $AsH_3$ & $SiH_4$ |
| $(GaP)_v In_x As_y Si_z^{(3)}$ | GaP | $In(CH_3)_3$ & $AsH_3$ & $SiH_4$ |
| $(AlAs)_v In_x As_y Si_z^{(3)}$ | AlAs | $In(CH_3)_3$ & $AsH_3$ & $SiH_4$ |
| $(AlSb)_v In_x As_y Si_z^{(3)}$ | AlSb | $In(CH_3)_3$ & $AsH_3$ & $SiH_4$ |
| $(AlP)_v In_x As_y Si_z^{(3)}$ | AlP | $In(CH_3)_3$ & $AsH_3$ & $SiH_4$ |
| $(InAs)_v In_x As_y Si_z^{(3)}$ | InAs | $In(CH_3)_3$ & $AsH_3$ & $SiH_4$ |
| $(InSb)_v In_x As_y Si_z^{(3)}$ | InSb | $In(CH_3)_3$ & $AsH_3$ & $SiH_4$ |
| $(InP)_v In_x As_y Si_z^{(3)}$ | InP | $In(CH_3)_3$ & $AsH_3$ & $SiH_4$ |
| $(GaAs)_v In_x As_y Ge_z^{(3)}$ | GaAs | $In(CH_3)_3$ & $AsH_3$ & $GeH_4$ |
| $(GaSb)_v In_x As_y Ge_z^{(3)}$ | GaSb | $In(CH_3)_3$ & $AsH_3$ & $GeH_4$ |
| $(GaP)_v In_x As_y Ge_z^{(3)}$ | GaP | $In(CH_3)_3$ & $AsH_3$ & $GeH_4$ |
| $(AlAs)_v In_x As_y Ge_z^{(3)}$ | AlAs | $In(CH_3)_3$ & $AsH_3$ & $GeH_4$ |
| $(AlSb)_v In_x As_y Ge_z^{(3)}$ | AlSb | $In(CH_3)_3$ & $AsH_3$ & $GeH_4$ |
| $(AlP)_v In_x As_y Ge_z^{(3)}$ | AlP | $In(CH_3)_3$ & $AsH_3$ & $GeH_4$ |
| $(InAs)_v In_x As_y Ge_z^{(3)}$ | InAs | $In(CH_3)_3$ & $AsH_3$ & $GeH_4$ |
| $(InSb)_v In_x As_y Ge_z^{(3)}$ | InSb | $In(CH_3)_3$ & $AsH_3$ & $GeH_4$ |
| $(InP)_v In_x As_y Ge_z^{(3)}$ | InP | $In(CH_3)_3$ & $AsH_3$ & $GeH_4$ |
| $(GaAs)_u In_v As_x Si_y Ge_z^{(4)}$ | GaAs | $In(CH_3)_3$ & $AsH_3$ & $SiH_4$ & $GeH_4$ |
| $(GaSb)_u In_v As_x Si_y Ge_z^{(4)}$ | GaSb | $In(CH_3)_3$ & $AsH_3$ & $SiH_4$ & $GeH_4$ |
| $(GaP)_u In_v As_x Si_y Ge_z^{(4)}$ | GaP | $In(CH_3)_3$ & $AsH_3$ & $SiH_4$ & $GeH_4$ |
| $(AlAs)_u In_v As_x Si_y Ge_z^{(4)}$ | AlAs | $In(CH_3)_3$ & $AsH_3$ & $SiH_4$ & $GeH_4$ |
| $(AlSb)_u In_v As_x Si_y Ge_z^{(4)}$ | AlSb | $In(CH_3)_3$ & $AsH_3$ & $SiH_4$ & $GeH_4$ |
| $(AlP)_u In_v As_x Si_y Ge_z^{(4)}$ | AlP | $In(CH_3)_3$ & $AsH_3$ & $SiH_4$ & $GeH_4$ |
| $(InAs)_u In_v As_x Si_y Ge_z^{(4)}$ | InAs | $In(CH_3)_3$ & $AsH_3$ & $SiH_4$ & $GeH_4$ |
| $(InSb)_u In_v As_x Si_y Ge_z^{(4)}$ | InSb | $In(CH_3)_3$ & $AsH_3$ & $SiH_4$ & $GeH_4$ |
| $(InP)_u In_v As_x Si_y Ge_z^{(4)}$ | InP | $In(CH_3)_3$ & $AsH_3$ & $SiH_4$ & $GeH_4$ |
| $(InAs)_v In_x As_y Sb_z^{(3)}$ | InAs | $In(CH_3)_3$ & $AsH_3$ & $SbH_3$ |
| $(InSb)_v In_x As_y Sb_z^{(3)}$ | InSb | $In(CH_3)_3$ & $AsH_3$ & $SbH_3$ |
| $(InP)_v In_x As_y Sb_z^{(3)}$ | InP | $In(CH_3)_3$ & $AsH_3$ & $SbH_3$ |
| $(GaAs)_v Ub_x As_y Sb_z^{(3)}$ | GaAs | $In(CH_3)_3$ & $AsH_3$ & $SbH_3$ |
| $(GaSb)_v In_x As_y Sb_z^{(3)}$ | GaSb | $In(CH_3)_3$ & $AsH_3$ & $SbH_3$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaP)_v In_x As_y Sb_z^{(3)}$ | GaP | $In(CH_3)_3$ & $AsH_3$ & $SbH_3$ |
| $(AlAs)_v In_x As_y Sb_z^{(3)}$ | AlAs | $In(CH_3)_3$ & $AsH_3$ & $SbH_3$ |
| $(AlSb)_v In_x As_y Sb_z^{(3)}$ | AlSb | $In(CH_3)_3$ & $AsH_3$ & $SbH_3$ |
| $(AlP)_v In_x As_y Sb_z^{(3)}$ | AlP | $In(CH_3)_3$ & $AsH_3$ & $SbH_3$ |
| $(InAs)_u In_v As_x Sb_y Si_z^{(4)}$ | InAs | $In(CH_3)_3$ & $AsH_3$ & $SbH_3$ & $SiH_4$ |
| $(InSb)_u In_v As_x Sb_y Si_z^{(4)}$ | InSb | $In(CH_3)_3$ & $AsH_3$ & $SbH_3$ & $SiH_4$ |
| $(InP)_u In_v As_x Sb_y Si_z^{(4)}$ | InP | $In(CH_3)_3$ & $AsH_3$ & $SbH_3$ & $SiH_4$ |
| $(GaAs)_u In_v As_x Sb_y Si_z^{(4)}$ | GaAs | $In(CH_3)_3$ & $AsH_3$ & $SbH_3$ & $SiH_4$ |
| $(GaSb)_u In_v As_x Sb_y Si_z^{(4)}$ | GaSb | $In(CH_3)_3$ & $AsH_3$ & $SbH_3$ & $SiH_4$ |
| $(GaP)_u In_v As_x Sb_y Si_z^{(4)}$ | GaP | $In(CH_3)_3$ & $AsH_3$ & $SbH_3$ & $SiH_4$ |
| $(AlAs)_u In_v As_x Sb_y Si_z^{(4)}$ | AlAs | $In(CH_3)_3$ & $AsH_3$ & $SbH_3$ & $SiH_4$ |
| $(AlSb)_u In_v As_x Sb_y Si_z^{(4)}$ | AlSb | $In(CH_3)_3$ & $AsH_3$ & $SbH_3$ & $SiH_4$ |
| $(AlP)_u In_v As_x Sb_y Si_z^{(4)}$ | AlP | $In(CH_3)_3$ & $AsH_3$ & $SbH_3$ & $SiH_4$ |
| $(InAs)_u In_v As_x Sb_y Ge_z^{(4)}$ | InAs | $In(CH_3)_3$ & $AsH_3$ & $SbH_3$ & $GeH_4$ |
| $(InSb)_u In_v As_x Sb_y Ge_z^{(4)}$ | InSb | $In(CH_3)_3$ & $AsH_3$ & $SbH_3$ & $GeH_4$ |
| $(InP)_u In_v As_x Sb_y Ge_z^{(4)}$ | InP | $In(CH_3)_3$ & $AsH_3$ & $SbH_3$ & $GeH_4$ |
| $(GaAs)_u In_v As_x Sb_y Ge_z^{(4)}$ | GaAs | $In(CH_3)_3$ & $AsH_3$ & $SbH_3$ & $GeH_4$ |
| $(GaSb)_u In_v As_x Sb_y Ge_z^{(4)}$ | GaSb | $In(CH_3)_3$ & $AsH_3$ & $SbH_3$ & $GeH_4$ |
| $(GaP)_u In_v As_x Sb_y Ge_z^{(4)}$ | GaP | $In(CH_3)_3$ & $AsH_3$ & $SbH_3$ & $GeH_4$ |
| $(AlAs)_u In_v As_x Sb_y Ge_z^{(4)}$ | AlAs | $In(CH_3)_3$ & $AsH_3$ & $SbH_3$ & $GeH_4$ |
| $(AlSb)_u In_v As_x Sb_y Ge_z^{(4)}$ | AlSb | $In(CH_3)_3$ & $AsH_3$ & $SbH_3$ & $GeH_4$ |
| $(AlP)_u In_v As_x Sb_y Ge_z^{(4)}$ | AlP | $In(CH_3)_3$ & $AsH_3$ & $SbH_3$ & $GeH_4$ |
| $(InAs)_t In_u As_v Sb_x Si_y Ge_z^{(5)}$ | InAs | $In(CH_3)_3$ & $AsH_3$ & $SbH_3$ & $SiH_4$ & $GeH_4$ |
| $(InSb)_t In_u As_v Sb_x Si_y Ge_z^{(5)}$ | InSb | $In(CH_3)_3$ & $AsH_3$ & $SbH_3$ & $SiH_4$ & $GeH_4$ |
| $(InP)_t In_u As_v Sb_x Si_y Ge_z^{(5)}$ | InP | $In(CH_3)_3$ & $AsH_3$ & $SbH_3$ & $SiH_4$ & $GeH_4$ |
| $(GaAs)_t In_u As_v Sb_x Si_y Ge_z^{(5)}$ | GaAs | $In(CH_3)_3$ & $AsH_3$ & $SbH_3$ & $SiH_4$ & $GeH_4$ |
| $(GaSb)_t In_u As_v Sb_x Si_y Ge_z^{(5)}$ | GaSb | $In(CH_3)_3$ & $AsH_3$ & $SbH_3$ & $SiH_4$ & $GeH_4$ |
| $(GaP)_t In_u As_v Sb_x Si_y Ge_z^{(5)}$ | GaP | $In(CH_3)_3$ & $AsH_3$ & $SbH_3$ & $SiH_4$ & $GeH_4$ |
| $(AlAs)_t In_u As_v Sb_x Si_y Ge_z^{(5)}$ | AlAs | $In(CH_3)_3$ & $AsH_3$ & $SbH_3$ & $SiH_4$ & $GeH_4$ |
| $(AlSb)_t In_u As_v Sb_x Si_y Ge_z^{(5)}$ | AlSb | $In(CH_3)_3$ & $AsH_3$ & $SbH_3$ & $SiH_4$ & $GeH_4$ |
| $(AlP)_t In_u As_v Sb_x Si_y Ge_z^{(5)}$ | AlP | $In(CH_3)_3$ & $AsH_3$ & $SbH_3$ & $SiH_4$ & $GeH_4$ |
| $(InAs)_v Al_x As_y Sb_z^{(3)}$ | InAs | $Al(CH_3)_3$ & $AsH_3$ & $SbH_3$ |
| $(InSb)_v Al_x As_y Sb_z^{(3)}$ | InSb | $Al(CH_3)_3$ & $AsH_3$ & $SbH_3$ |
| $(InP)_v Al_x As_y Sb_z^{(3)}$ | InP | $Al(CH_3)_3$ & $AsH_3$ & $SbH_3$ |
| $(GaAs)_v Al_x As_y Sb_z^{(3)}$ | GaAs | $Al(CH_3)_3$ & $AsH_3$ & $SbH_3$ |
| $(GaSb)_v Al_x As_y Sb_z^{(3)}$ | GaSb | $Al(CH_3)_3$ & $AsH_3$ & $SbH_3$ |
| $(GaP)_v Al_x As_y Sb_z^{(3)}$ | GaP | $Al(CH_3)_3$ & $AsH_3$ & $SbH_3$ |
| $(AlAs)_v Al_x As_y Sb_z^{(3)}$ | AlAs | $Al(CH_3)_3$ & $AsH_3$ & $SbH_3$ |
| $(AlSb)_v Al_x As_y Sb_z^{(3)}$ | AlSb | $Al(CH_3)_3$ & $AsH_3$ & $SbH_3$ |
| $(AlP)_v Al_x As_y Sb_z^{(3)}$ | AlP | $Al(CH_3)_3$ & $AsH_3$ & $SbH_3$ |
| $(InAs)_u Al_v As_x Sb_y Si_z^{(4)}$ | InAs | $Al(CH_3)_3$ & $AsH_3$ & $SbH_3$ & $SiH_4$ |
| $(InSb)_u Al_v As_x Sb_y Si_z^{(4)}$ | InSb | $Al(CH_3)_3$ & $AsH_3$ & $SbH_3$ & $SiH_4$ |
| $(InP)_u Al_v As_x Sb_y Si_z^{(4)}$ | InP | $Al(CH_3)_3$ & $AsH_3$ & $SbH_3$ & $SiH_4$ |
| $(GaAs)_u Al_v As_x Sb_y Si_z^{4}$ | GaAs | $Al(CH_3)_3$ & $AsH_3$ & $SbH_3$ & $SiH_4$ |
| $(GaSb)_u Al_v As_x Sb_y Si_z^{(4)}$ | GaSb | $Al(CH_3)_3$ 3 $AsH_3$ & $SbH_3$ & $SiH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaP)_u Al_v As_x Sb_y Si_z^{(4)}$ | GaP | $Al(CH_3)_3$ & $AsH_3$ & $SbH_3$ & $SiH_4$ |
| $(AlAs)_u Al_v As_x Sb_y Si_z^{(4)}$ | AlAs | $Al(CH_3)_3$ & $AsH_3$ & $SbH_3$ & $SiH_4$ |
| $(AlSb)_u Al_v As_x Sb_y Si_z^{(4)}$ | AlSb | $Al(CH_3)_3$ & $AsH_3$ & $SbH_3$ & $SiH_4$ |
| $(AlP)_u Al_v As_x Sb_y Si_z^{(4)}$ | AlP | $Al(CH_3)_3$ & $AsH_3$ & $SbH_3$ & $SiH_4$ |
| $(InAs)_u Al_v As_x Sb_y Ge_z^{(4)}$ | InAs | $Al(CH_3)_3$ & $AsH_3$ & $SbH_3$ & $GeH_4$ |
| $(InSb)_u Al_v As_x Sb_y Ge_z^{(4)}$ | InSb | $Al(CH_3)_3$ & $AsH_3$ & $SbH_3$ & $GeH_4$ |
| $(InP)_u Al_v As_x Sb_y Ge_z^{(4)}$ | InP | $Al(CH_3)_3$ & $AsH_3$ & $SbH_3$ & $GeH_4$ |
| $(GaAs)_u Al_v As_x Sb_y Ge_z^{(4)}$ | GaAs | $Al(CH_3)_3$ & $AsH_3$ & $SbH_3$ & $GeH_4$ |
| $(GaSb)_u Al_v As_x Sb_y Ge_z^{(4)}$ | GaSb | $Al(CH_3)_3$ & $AsH_3$ & $SbH_3$ & $GeH_4$ |
| $(GaP)_u Al_v As_x Sb_y Ge_z^{(4)}$ | GaP | $Al(CH_3)_3$ & $AsH_3$ & $SbH_3$ & $GeH_4$ |
| $(AlAs)_u Al_v As_x Sb_y Ge_z^{(4)}$ | AlAs | $Al(CH_3)_3$ & $AsH_3$ & $SbH_3$ & $GeH_4$ |
| $(AlSb)_u Al_v As_x Sb_y Ge_z^{(4)}$ | AlSb | $Al(CH_3)_3$ & $AsH_3$ & $SbH_3$ & $GeH_4$ |
| $(AlP)_u Al_v As_x Sb_y Ge_z^{(4)}$ | AlP | $Al(CH_3)_3$ & $AsH_3$ & $SbH_3$ & $GeH_4$ |
| $(InAs)_t Al_u As_v Sb_x Si_y Ge_z^{(5)}$ | InAs | $Al(CH_3)_3$ & $AsH_3$ & $SbH_3$ & $SiH_4$ & $GeH_4$ |
| $(InSb)_t Al_u As_v Sb_x Si_y Ge_z^{(5)}$ | InSb | $Al(CH_3)_3$ & $AsH_3$ & $SbH_3$ & $SiH_4$ & $GeH_4$ |
| $(InP)_t Al_u As_v Sb_x Si_y Ge_z^{(5)}$ | InP | $Al(CH_3)_3$ & $AsH_3$ & $SbH_3$ & $SiH_4$ & $GeH_4$ |
| $(GaAs)_t Al_u As_v Sb_x Si_y Ge_z^{(5)}$ | GaAs | $Al(CH_3)_3$ & $AsH_3$ & $SbH_3$ & $SiH_4$ & $GeH_4$ |
| $(GaSb)_t Al_u As_v Sb_x Si_y Ge_z^{(5)}$ | GaSb | $Al(CH_3)_3$ & $AsH_3$ & $SbH_3$ & $GeH_4$ |
| $(GaP)_t Al_u As_v Sb_x Si_y Ge_z^{(5)}$ | GaP | $Al(CH_3)_3$ & $AsH_3$ & $SbH_3$ & $SiH_4$ & $GeH_4$ |
| $(AlAs)_t Al_u As_v Sb_x Si_y Ge_z^{(5)}$ | AlAs | $Al(CH_3)_3$ & $AsH_3$ & $SbH_3$ & $SiH_4$ & $GeH_4$ |
| $(AlSb)_t Al_u As_v Sb_x Si_y Ge_z^{(5)}$ | AlSb | $Al(CH_3)_3$ & $AsH_3$ & $SbH_3$ & $SiH_4$ & $GeH_4$ |
| $(AlP)_t Al_u As_v Sb_x Si_y Ge_z^{(5)}$ | AlP | $Al(CH_3)_3$ & $AsH_3$ & $SbH_3$ & $SiH_4$ & $GeH_4$ |
| $(InAs)_y Ga_x As_y Sb_z^{(3)}$ | InAs | $Ga(CH_3)_3$ & $AsH_3$ & $SbH_3$ |
| $(InSb)_y Ga_x As_y Sb_z^{(3)}$ | InSb | $Ga(CH_3)_3$ & $AsH_3$ & $SbH_3$ |
| $(InP)_y Ga_x As_y Sb_z^{(3)}$ | InP | $Ga(CH_3)_3$ & $AsH_3$ & $SbH_3$ |
| $(GaAs)_y Ga_x As_y Sb_z^{(3)}$ | GaAs | $Ga(CH_3)_3$ & $AsH_3$ & $SbH_3$ |
| $(GaSb)_y Ga_x As_y Sb_z^{(3)}$ | GaSb | $Ga(CH_3)_3$ & $AsH_3$ & $SbH_3$ |
| $(GaP)_y Ga_x As_y Sb_z^{(3)}$ | GaP | $Ga(CH_3)_3$ & $AsH_3$ & $SbH_3$ |
| $(AlAs)_y Ga_x As_y Sb_z^{(3)}$ | AlAs | $Ga(CH_3)_3$ & $AsH_3$ & $SbH_3$ |
| $(AlSb)_y Ga_x As_y Sb_z^{(3)}$ | AlSb | $Ga(CH_3)_3$ & $AsH_3$ & $SbH_3$ |
| $(AlP)_y Ga_x As_y Sb_z^{(3)}$ | AlP | $Ga(CH_3)_3$ & $AsH_3$ & $SbH_3$ |
| $(InAs)_u Ga_v As_x Sb_y Si_z^{(4)}$ | InAs | $Ga(CH_3)_3$ & $AsH_3$ & $SbH_3$ & $SiH_4$ |
| $(InSb)_u Ga_v As_x Sb_y Si_z^{(4)}$ | InSb | $Ga(CH_3)_3$ & $AsH_3$ & $SbH_3$ & $SiH_4$ |
| $(InP)_u Ga_v As_x Sb_y Si_z^{(4)}$ | InP | $Ga(CH_3)_3$ & $AsH_3$ & $SbH_3$ & $SiH_4$ |
| $(GaAs)_u Ga_v As_x Sb_y Si_z^{(4)}$ | GaAs | $Ga(CH_3)_3$ & $AsH_3$ & $SbH_3$ & $SiH_4$ |
| $(GaSb)_u Ga_v As_x Sb_y Si_z^{(4)}$ | GaSb | $Ga(CH_3)_3$ & $AsH_3$ & $SbH_3$ & $SiH_4$ |
| $(GaP)_u Ga_v As_x Sb_y Si_z^{(4)}$ | GaP | $Ga(CH_3)_3$ & $AsH_3$ & $SbH_3$ & $SiH_4$ |
| $(AlAs)_u Ga_v As_x Sb_y Si_z^{(4)}$ | AlAs | $Ga(CH_3)_3$ & $AsH_3$ & $SbH_3$ & $SiH_4$ |
| $(AlSb)_u Ga_v As_x Sb_y Si_z^{(4)}$ | AlSb | $Ga(CH_3)_3$ & $AsH_3$ & $SbH_3$ & $SiH_4$ |
| $(AlP)_u Ga_v As_x Sb_y Si_z^{(4)}$ | AlP | $Ga(CH_3)_3$ & $AsH_3$ & $SbH_3$ & $SiH_4$ |
| $(InAs)_t Ga_u As_v Sb_x Si_y Ge_z^{(5)}$ | InAs | $Ga(CH_3)_3$ & $AsH_3$ & $SbH_3$ & $SiH_4$ & $GeH_4$ |
| $(InSb)_t Ga_u As_v Sb_x Si_y Ge_z^{(5)}$ | InSb | $Ga(CH_3)_3$ & $AsH_3$ & $SbH_3$ & $SiH_4$ & $GeH_4$ |
| $(InP)_t Ga_u As_v Sb_x Si_y Ge_z^{(5)}$ | InP | $Ga(CH_3)_3$ & $AsH_3$ & $SbH_3$ & $SiH_4$ & $GeH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(GaAs)_rGa_uAs_vSb_xSi_yGe_z^{(5)}$ | GaAs | $Ga(CH_3)_3$ & $AsH_3$ & $SbH_3$ & $SiH_4$ & $GeH_4$ |
| $(GaSb)_rGa_uAs_vSb_xSi_yGe_z^{(5)}$ | GaSb | $Ga(CH_3)_3$ & $AsH_3$ & $SbH_3$ & $SiH_4$ & $GeH_4$ |
| $(GaP)_rGa_uAs_vSb_xSi_yGe_z^{(5)}$ | GaP | $Ga(CH_3)_3$ & $AsH_3$ & $SbH_3$ & $SiH_4$ & $GeH_4$ |
| $(AlAs)_rGa_uAs_vSb_xSi_yGe_z^{(5)}$ | AlAs | $Ga(CH_3)_3$ & $AsH_3$ & $SbH_3$ & $SiH_4$ & $GeH_4$ |
| $(AlSb)_rGa_uAs_vSb_xSi_yGe_z^{(5)}$ | AlSb | $Ga(CH_3)_3$ & $AsH_3$ & $SbH_3$ & $SiH_4$ & $GeH_4$ |
| $(AlP)_rGa_uAs_vSb_xSi_yGe_z^{(5)}$ | AlP | $Ga(CH_3)_3$ & $AsH_3$ & $SbH_3$ & $SiH_4$ & $GeH_4$ |
| $In_xSb_yAs_z^{(2)}$ | In | $SbH_3$ & $AsH_3$ |
| $In_xP_yAs_z^{(2)}$ | In | $PH_3$ & $AsH_3$ |
| $In_xP_ySb_z^{(2)}$ | In | $PH_3$ & $SbH_3$ |
| $Ga_xSb_yAs_z^{(2)}$ | Ga | $SbH_3$ & $AsH_3$ |
| $Ga_xP_yAs_z^{(2)}$ | Ga | $PH_3$ & $AsH_3$ |
| $Ga_xP_ySb_z^{(2)}$ | Ga | $PH_3$ & $SbH_3$ |
| $Al_xSb_yAs_z^{(2)}$ | Al | $SbH_3$ & $AsH_3$ |
| $Al_xP_yAs_z^{(2)}$ | Al | $PH_3$ & $AsH_3$ |
| $Al_xP_ySb_z^{(2)}$ | Al | $PH_3$ & $SbH_3$ |
| $In_vSb_xAs_ySi_z^{(3)}$ | In | $SbH_3$ & $AsH_3$ & $SiH_4$ |
| $In_vP_xAs_ySi_z^{(3)}$ | In | $PH_3$ & $AsH_3$ & $SiH_4$ |
| $In_vP_xSb_ySi_z^{(3)}$ | In | $PH_3$ & $SbH_3$ & $SiH_4$ |
| $Ga_vSb_xAs_ySi_z^{(3)}$ | Ga | $SbH_3$ & $AsH_3$ & $SiH_4$ |
| $Ga_vP_xAs_ySi_z^{(3)}$ | Ga | $PH_3$ & $AsH_3$ & $SiH_4$ |
| $Ga_vP_xSb_ySi_z^{(3)}$ | Ga | $PH_3$ & $SbH_3$ & $SiH_4$ |
| $Ga_vP_xSb_ySi_z^{(3)}$ | Ga | $PH_3$ & $SbH_3$ & $SiH_4$ |
| $Al_vSb_xAs_ySi_z^{(3)}$ | Al | $SbH_3$ & $AsH_3$ & $SiH_4$ |
| $Al_vP_xAs_ySi_z^{(3)}$ | Al | $PH_3$ & $AsH_3$ & $SiH_4$ |
| $Al_vP_xSb_ySi_z^{(3)}$ | Al | $PH_3$ & $SbH_3$ & $SiH_4$ |
| $In_vSb_xAs_yGe_z^{(3)}$ | In | $SbH_3$ & $AsH_3$ & $GeH_4$ |
| $In_vP_xAs_yGe_z^{(3)}$ | In | $PH_3$ & $AsH_3$ & $GeH_4$ |
| $In_vP_xSb_yGe_z^{(3)}$ | In | $PH_3$ & $SbH_3$ & $GeH_4$ |
| $Ga_vSb_xAs_yGe_z^{(3)}$ | Ga | $SbH_3$ & $AsH_3$ & $GeH_4$ |
| $Ga_vP_xAs_yGe_z^{(3)}$ | Ga | $PH_3$ & $AsH_3$ & $GeH_4$ |
| $Ga_vP_xSb_yGe_z^{(3)}$ | Ga | $PH_3$ & $SbH_3$ & $GeH_4$ |
| $Al_vSb_xAs_yGe_z^{(3)}$ | Al | $SbH_3$ & $AsH_3$ & $GeH_4$ |
| $Al_vP_xAs_yGe_z^{(3)}$ | Al | $PH_3$ & $AsH_3$ & $GeH_4$ |
| $Al_vP_xSb_yGe_z^{(3)}$ | Al | $PH_3$ & $SbH_3$ & $GeH_4$ |
| $In_uSb_vAs_xSi_yGe_z^{(4)}$ | In | $SbH_3$ & $AsH_3$ & $SiH_4$ & $GeH_4$ |
| $In_uP_vAs_xSi_yGe_z^{(4)}$ | In | $PH_3$ & $AsH_3$ & $SiH_4$ & $GeH_4$ |
| $In_uP_vSb_xSi_yGe_z^{(4)}$ | In | $PH_3$ & $SbH_3$ & $SiH_4$ & $GeH_4$ |
| $Ga_uSb_vAs_xSi_yGe_z^{(4)}$ | Ga | $SbH_3$ & $AsH_3$ & $SiH_4$ & $GeH_4$ |
| $Ga_uP_vAs_xSi_yGe_z^{(4)}$ | Ga | $PH_3$ & $AsH_3$ & $SiH_4$ & $GeH_4$ |
| $Ga_uP_vSb_xSi_yGe_z^{(4)}$ | Ga | $PH_3$ & $SbH_3$ & $SiH_4$ & $GeH_4$ |
| $Al_uSb_vAs_xSi_yGe_z^{(4)}$ | Al | $SbH_3$ & $AsH_3$ & $SiH_4$ & $GeH_4$ |
| $Al_uP_vAs_xSi_yGe_z^{(4)}$ | Al | $PH_3$ & $AsH_3$ & $SiH_4$ & $GeH_4$ |
| $Al_uP_vSb_xSi_yGe_z^{(4)}$ | Al | $PH_3$ & $SbH_3$ & $SiH_4$ & $GeH_4$ |
| $In_xSb_ySi_z^{(2)}$ | In | $SbH_3$ & $SiH_4$ |
| $In_xP_ySi_z^{(2)}$ | In | $PH_3$ & $SiH_4$ |
| $In_xAs_ySi_z^{(2)}$ | In | $AsH_3$ & $SiH_4$ |
| $Ga_xSb_ySi_z^{(2)}$ | Ga | $SbH_3$ & $SiH_4$ |
| $Ga_xP_ySi_z^{(2)}$ | Ga | $PH_3$ & $SiH_4$ |
| $Ga_xAs_ySi_z^{(2)}$ | Ga | $AsH_3$ & $SiH_4$ |
| $Al_xSb_ySi_z^{(2)}$ | Al | $SbH_3$ & $SiH_4$ |
| $Al_xP_ySi_z^{(2)}$ | Al | $PH_3$ & $SiH_4$ |
| $Al_xAs_ySi_z^{(2)}$ | Al | $AsH_3$ & $SiH_4$ |
| $In_xSb_yGe_z^{(2)}$ | In | $SbH_3$ & $GeH_4$ |
| $In_xP_yGe_z^{(2)}$ | In | $PH_3$ & $GeH_4$ |
| $In_xAs_yGe_z^{(2)}$ | In | $AsH_3$ & $GeH_4$ |
| $Ga_xSb_yGe_z^{(2)}$ | Ga | $SbH_3$ & $GeH_4$ |
| $Ga_xP_yGe_z^{(2)}$ | Ga | $PH_3$ & $GeH_4$ |
| $Ga_xAs_yGe_z^{(2)}$ | Ga | $AsH_3$ & $GeH_4$ |
| $Al_xP_yGe_z^{(2)}$ | Al | $PH_3$ & $GeH_4$ |
| $Al_xSb_yGe_z^{(2)}$ | Al | $SbH_3$ & $GeH_4$ |
| $Al_xAs_yGe_z^{(2)}$ | Al | $AsH_3$ & $GeH_4$ |
| $In_vSb_xSi_yGe_z^{(3)}$ | In | $SbH_3$ & $SiH_4$ & $GeH_4$ |
| $In_vP_xSi_yGe_z^{(3)}$ | In | $PH_3$ & $SiH_4$ & $GeH_4$ |
| $In_vAs_xSi_yGe_z^{(3)}$ | In | $AsH_3$ & $SiH_4$ & $GeH_4$ |
| $Ga_vSb_xSi_yGe_z^{(3)}$ | Ga | $SbH_3$ & $SiH_4$ & $GeH_4$ |
| $Ga_vP_xSi_yGe_z^{(3)}$ | Ga | $PH_3$ & $SiH_4$ & $GeH_4$ |
| $Ga_vAs_xSi_yGe_z^{(3)}$ | Ga | $AsH_3$ & $SiH_4$ & $GeH_4$ |
| $Al_vP_xSi_yGe_z^{(3)}$ | Al | $PH_3$ & $SiH_4$ & $GeH_4$ |
| $Al_vSb_xSi_yGe_z^{(3)}$ | Al | $SbH_3$ & $SiH_4$ & $GeH_4$ |
| $Al_vAs_xSi_yGe_z^{(3)}$ | Al | $AsH_3$ & $SiH_4$ & $GeH_4$ |
| $(InAs)_vIn_xSb_ySi_z^{(3)}$ | InAs | $In(CH_3)_3$ & $SbH_3$ & $SiH_4$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| $(InSb)_v In_x Sb_y Si_z^{(3)}$ | InSb | $In(CH_3)_3$ & $SbH_3$ & $SiH_4$ |
| $(InP)_v In_x Sb_y Si_z^{(3)}$ | InP | $In(CH_3)_3$ & $SbH_3$ & $SiH_4$ |
| $(GaAs)_v In_x Sb_y Si_z^{(3)}$ | GaAs | $In(CH_3)_3$ & $SbH_3$ & $SiH_4$ |
| $(GaP)_v In_x Sb_y Si_z^{(3)}$ | GaP | $In(CH_3)_3$ & $SbH_3$ & $SiH_4$ |
| $(GaSb)_v In_x Sb_y Si_z^{(3)}$ | GaSb | $In(CH_3)_3$ & $SbH_3$ & $SiH_4$ |
| $(AlP)_v In_x Sb_y Si_z^{(3)}$ | AlP | $In(CH_3)_3$ & $SbH_3$ & $SiH_4$ |
| $(AlSb)_v In_x Sb_y Si_z^{(3)}$ | AlSb | $In(CH_3)_3$ & $SbH_3$ & $SiH_4$ |
| $(AlAs)_v In_x Sb_y Si_z^{(3)}$ | AlAs | $In(CH_3)_3$ & $SbH_3$ & $SiH_4$ |
| $(InAs)_v In_x Sb_y Ge_z^{(3)}$ | InAs | $In(CH_3)_3$ & $SbH_3$ & $GeH_4$ |
| $(InSb)_v In_x Sb_y Ge_z^{(3)}$ | InSb | $In(CH_3)_3$ & $SbH_3$ $GeH_4$ |
| $(InP)_v In_x Sb_y Ge_z^{(3)}$ | InP | $In(CH_3)_3$ & $SbH_3$ & $GeH_4$ |
| $(GaAs)_v In_x Sb_y Ge_z^{(3)}$ | GaAs | $In(CH_3)_3$ & $SbH_3$ & $GeH_4$ |
| $(GaP)_v In_x Sb_y Ge_z^{(3)}$ | GaP | $In(CH_3)_3$ & $SbH_3$ & $GeH_4$ |
| $(GaSb)_v In_x Sb_y Ge_z^{(3)}$ | GaSb | $In(CH_3)_3$ & $SbH_3$ & $GeH_4$ |
| $(AlP)_v In_x Sb_y Si_z^{(3)}$ | AlP | $In(CH_3)_3$ & $SbH_3$ & $SiH_4$ |
| $(AlSb)_v In_x Sb_y Si_z^{(3)}$ | AlSb | $In(CH_3)_3$ & $SbH_3$ & $SiH_4$ |
| $(AlAs)_v In_x Sb_y Si_z^{(3)}$ | AlAs | $In(CH_3)_3$ & $SbH_3$ & $SiH_4$ |
| $(InAs)_v In_x Sb_y Ge_z^{(3)}$ | InAs | $In(CH_3)_3$ & $SbH_3$ & $GeH_4$ |
| $(InSb)_v In_x Sb_y Ge_z^{(3)}$ | InSb | $In(CH_3)_3$ & $SbH_3$ & $GeH_4$ |
| $(InP)_v In_x Sb_y Ge_z^{(3)}$ | InP | $In(CH_3)_3$ & $SbH_3$ & $GeH_4$ |
| $(GaAs)_v In_x Sb_y Ge_z^{(3)}$ | GaAs | $In(CH_3)_3$ & $SbH_3$ & $GeH_4$ |
| $(GaP)_v In_x Sb_y Ge_z^{(3)}$ | GaP | $In(CH_3)_3$ & $SbH_3$ & $GeH_4$ |
| $(GaSb)_v In_x Sb_y Ge_z^{(3)}$ | GaSb | $In(CH_3)_3$ & $SbH_3$ & $GeH_4$ |
| $(AlP)_v In_x Sb_y Ge_z^{(3)}$ | AlP | $In(CH_3)_3$ & $SbH_3$ & $GeH_4$ |
| $(AlSb)_v In_x Sb_y Ge_z^{(3)}$ | AlSb | $In(CH_3)_3$ & $SbH_3$ & $GeH_4$ |
| $(AlAs)_v In_x Sb_y Ge_z^{(3)}$ | AlAs | $In(CH_3)_3$ & $SbH_3$ & $GeH_4$ |
| $(InAs)_u In_v Sb_x Si_y Ge_z^{(4)}$ | InAs | $In(CH_3)_3$ & $SbH_3$ & $SiH_4$ & $GeH_4$ |
| $(InSb)_u In_v Sb_x Si_y Ge_z^{(4)}$ | InSb | $In(CH_3)_3$ & $SbH_3$ & $SiH_4$ & $GeH_4$ |
| $(InP)_u In_v Sb_x Si_y Ge_z^{(4)}$ | InP | $In(CH_3)_3$ & $SbH_3$ & $SiH_4$ & $GeH_4$ |
| $(GaAs)_u In_v Sb_x Si_y Ge_z^{(4)}$ | GaAs | $In(CH_3)_3$ & $SiH_4$ & $GeH_4$ |
| $(GaP)_u In_v Sb_x Si_y Ge_z^{(4)}$ | GaP | $In(CH_3)_3$ & $SbH_3$ & $SiH_4$ & $GeH_4$ |
| $(GaSb)_u In_v Sb_x Si_y Ge_z^{(4)}$ | GaSb | $In(CH_3)_3$ & $SbH_3$ & $SiH_4$ & $GeH_4$ |
| $(AlP)_u In_v Sb_x Si_y Ge_z^{(4)}$ | AlP | $In(CH_3)_3$ & $SbH_3$ & $SiH_4$ & $GeH_4$ |
| $(AlSb)_u In_v Sb_x Si_y Ge_z^{(4)}$ | AlSb | $In(CH_3)_3$ & $SbH_3$ & $SiH_4$ & $GeH_4$ |
| $(AlAs)_u In_v Sb_x Si_y Ge_z^{(4)}$ | AlAs | $In(CH_3)_3$ & $SbH_3$ & $SiH_4$ & $GeH_4$ |
| $(InAs)_v As_x Si_y Ge_z^{(3)}$ | InAs | $AsH_3$ & $SiH_4$ & $GeH_4$ |
| $(InSb)_v As_x Si_y Ge_z^{(3)}$ | InSb | $AsH_3$ & $SiH_4$ & $GeH_4$ |
| $(InP)_v As_x Si_y Ge_z^{(3)}$ | InP | $AsH_3$ & $SiH_4$ & $GeH_4$ |
| $(GaAs)_v As_x Si_y Ge_z^{(3)}$ | GaAs | $AsH_3$ & $SiH_4$ & $GeH_4$ |
| $(GaP)_v As_x Si_y Ge_z^{(3)}$ | GaP | $AsH_3$ & $SiH_4$ & $GeH_4$ |
| $(GaSb)_v As_x Si_y Ge_z^{(3)}$ | GaSb | $AsH_3$ & $SiH_4$ & $GeH_4$ |
| $(AlP)_v As_x Si_y Ge_z^{(3)}$ | AlP | $AsH_3$ & $SiH_4$ & $GeH_4$ |
| $(AlSb)_v As_x Si_y Ge_z^{(3)}$ | AlSb | $AsH_3$ & $SiH_4$ & $GeH_4$ |
| $(AlAs)_v As_x Si_y Ge_z^{(3)}$ | AlAs | $AsH_3$ & $SiH_4$ & $GeH_4$ |
| $(InAs)_v Sb_x Si_y Ge_z^{(3)}$ | InAs | $SbH_3$ & $SiH_4$ & $GeH_4$ |
| $InSb)_v Sb_x Si_y Ge_z^{(3)}$ | InSb | $SbH_3$ & $SiH_4$ & $GeH_4$ |
| $(InP)_v Sb_x Si_y Ge_z^{(3)}$ | InP | $SbH_3$ & $SiH_4$ & $GeH_4$ |
| $(GaAs)_v Sb_x Si_y Ge_z^{(3)}$ | GaAs | $SbH_3$ & $SiH_4$ & $GeH_4$ |
| $(GaP)_v Sb_x Si_y Ge_z^{(3)}$ | GaP | $SbH_3$ & $SiH_4$ & $GeH_4$ |
| $(GaSb)_v Sb_x Si_y Ge_z^{(3)}$ | GaSb | $SbH_3$ & $SiH_4$ & $GeH_4$ |
| $(AlP)_v Sb_x Si_y Ge_z^{(3)}$ | AlP | $SbH_3$ & $SiH_4$ & $GeH_4$ |
| $(AlSb)_v Sb_x Si_y Ge_z^{(3)}$ | AlSb | $SbH_3$ & $SiH_4$ & $GeH_4$ |
| $(AlAs)_v Sb_x Si_y Ge_z^{(3)}$ | AlAs | $SbH_3$ & $SiH_4$ & $GeH_4$ |
| $(InAs)_u (InSb)_v In_x As_y Sb_z^{(4)}$ | InAs & InSb | $In(CH_3)_3$ & $AsH_3$ & $SbH_3$ |
| $(InP)_u (InAs)_v In_x As_y Sb_z^{(4)}$ | InP & InAs | $In(CH_3)_3$ & $AsH_3$ & $SbH_3$ |
| $(GaAs)_u (InSb)_v In_x As_y Sb_z^{(4)}$ | GaAs & InSb | $In(CH_3)_3$ & $AsH_3$ & $SbH_3$ |
| $(GaP)_u (InSb)_v In_x As_y Sb_z^{(4)}$ | GaP & InSb | $In(CH_3)_3$ & $AsH_3$ & $SbH_3$ |
| $(GaSb)_u (InSb)_v In_x As_y Sb_z^{(4)}$ | GaSb & InSb | $In(CH_3)_3$ & $AsH_3$ & $SbH_3$ |
| $(AlP)_u (InSb)_v In_x As_y Sb_z^{(4)}$ | AlP & InSb | $In(CH_3)_3$ & $AsH_3$ & $SbH_3$ |
| $(AlSb)_u (InSb)_v In_x As_y Sb_z^{(4)}$ | AlSb & InSb | $In(CH_3)_3$ & $AsH_3$ & $SbH_3$ |
| $(AlAs)_u (InSb)_v In_x As_y Sb_z^{(4)}$ | AlAs & InSb | $In(CH_3)_3$ & $AsH_3$ & $SbH_3$ |
| $(GaAs)_v (InAs)_x (AlAs)_y Sb_z^{(3)}$ | GaAs & InAs & AlAs | $SbH_3$ or $Sb(CH_3)_3$ |
| $(GaAs)_v (InSb)_x (AlP)_y Si_z^{(3)}$ | GaAs & InSb & AlP | $SiH_4$ or $SiCl_4$ |
| $(GaSb)_v (InP)_x (AlSb)_y Ge_z^{(3)}$ | GaSb & InP & AlSb | $GeH_4$ or $Ge(CH_3)_4$ |
| $(GaAs)_v (InAs)_x (AlAs)_y As_z^{(3)}$ | GaAs & InAs | $AsH_3$ or $As(CH_3)_3$ |

TABLE II-continued
EXAMPLES OF NOVEL SOLID SOLUTIONS AND PREPARATIVE SPUTTER TARGETS AND REACTIVE GASES

| Solid Solution composition | Sputter Target Composition | Reactive Gas Composition |
|---|---|---|
| | & AlAs | |
| $(GaP)_u(InSb)_v(AlSb)_xSb_y^{(4)}As_z$ | GaP & InSb & AlSb | $SbH_3$ & $AsH_3$ |
| $(GaAs)_u(GaSb)_v(GaP)_xIn_y^{(4)}Sb_z$ | GaAs & GaSb & GaP | $In(CH_3)_3$ & $SbH_3$ |
| $(GaAs)_u(GaSb)_v(InAs)_xAs_y^{(4)}Sb_z$ | GaAs & GaSb & InAs | $AsH_3$ & $SbH_3$ |
| $(GaAs)_v(GaSb)_x(InSb)_ySb_z^{(3)}$ | GaAs & GaSb & InSb | $SbH_3$ |
| $(GaAs)_v(GaSb)_x(InP)_yAs_z^{(3)}$ | GaAs & GaSb & InP | $AsH_3$ |
| $(GaAs)_u(GaSb)_v(AlP)_xAs_y^{(4)}Si_z$ | GaAs & GaSb & AlP | $AsH_3$ & $SiH_4$ |
| $(GaAs)_t(GaSb)_u(AlAs)_vAs_x^{(5)}Si_yGe_z$ | GaAs & GaSb & AlAs | $AsH_3$ & $SiH_4$ & $GeH_4$ |
| $(GaAs)_v(GaSb)_x(AlSb)_ySb_z^{(3)}$ | GaAs & GaSb & AlSb | $SbH_3$ |
| $(GaAs)_u(InSb)_v(GaP)_xIn_y^{(4)}Sb_z$ | GaAs & InSb & GaP | $In(CH_3)_3$ & $SbH_3$ |
| $(GaAs)_u(InSb)_v(AlAs)_xAs_y^{(4)}Sb_z$ | GaAs & InSb & AlAs | $AsH_3$ & $SbH_3$ |
| $(GaAs)_u(InSb)_v(AlSb)_xP_y^{(4)}Sb_z$ | GaAs & InSb & AlSb | $PH_3$ & $SbH_3$ |
| $(GaAs)_u(InSb)_v(InP)_xIn_y^{(4)}As_z$ | GaAs & InSb & InP | $In(CH_3)_3$ & $AsH_3$ |
| $(GaAs)_u(InSb)_v(InAs)_xGa_y^{(4)}Si_z$ | GaAs & InSb & InAs | $Ga(CH_3)_3$ & $SiH_4$ |
| $(GaAs)_t(GaP)_u(InSb)_vGa_x^{(5)}Si_yGe_z$ | GaAs & GaP & InSb | $Ga(CH_3)_3$ & $SiH_4$ & $GeH_4$ |
| $(GaAs)_v(GaP)_x(InP)_ySi_z^{(3)}$ | GaAs & GaP & InP | $SiH_4$ or $SiCl_4$ |
| $(GaAs)_v(GaP)_x(AlSb)_yGe_z^{(3)}$ | GaAs & GaP & AlSb | $Ge(CH_3)_4$ or $GeH_4$ |
| $(InSb)_v(InAs)_x(InP)_yIn_z^{(3)}$ | InSb & InAs & InP | $In(CH_3)_3$ |
| $(AlSb)_v(AlAs)_x(AlP)_yAl_z^{(3)}$ | AlSb & AlAs & AlP | $Al(CH_3)_3$ |
| $(BN)_u(AlN)_v(GaN)_xIn_ySb_z^{(4)}$ | BN & AlN & GaN | $In(CH_3)_3$ & $SbH_3$ |
| $(AlN)_v(GaN)_x(InN)_ySb_z^{(3)}$ | AlN & GaN & InN | $SbH_3$ |
| $(GaN)_v(BN)_x(InN)_ySi_z^{(3)}$ | GaN & BN & InN | $SiH_4$ |
| $(InN)_v(AlIn)_x(BN)_yGe_z^{(3)}$ | InN & AlN & BN | $GeH_4$ |
| $(BP)_u(InSb)_v(AlSb)_xAs_y^{(4)}Sb_z$ | BP & InSb & AlSb | $AsH$ & $SbH_3$ |
| $(AlP)_v(BP)_x(InP)_ySb_z^{(3)}$ | AlP & BP & InP | $SbH_3$ |
| $(AlSb)_u(AlP)_v(InAs)_xP_y^{(4)}Sb_z$ | AlSb & AlP & InAs | $PH_3$ & $SbH_3$ |
| $(InP)_v(AlAs)_x(InAs)_ySi_z^{(3)}$ | InP & AlAs & InAs | $SiH_4$ |
| $(AlAs)_v(InSb)_x(AlSb)_ySb_z^{(3)}$ | AlAs & InSb & AlSb | $SbH_3$ |
| $(InAs)_v(AlSb)_x(AlAs)_yAs_z^{(3)}$ | InAs & AlSb & AlAs | $AsH_3$ |
| $(AlSb)_v(InSb)_x(InP)_yGe_z^{(3)}$ | AlSb & InSb & InP | $GeH_4$ |
| $(InSb)_u(BP)_v(AlP)_xSi_yGe_z^{(4)}$ | InSb & BP & AlP | $SiH_4$ & $GeH_4$ |

[1] Where x is a number greater than about 0.01 and x + (1−x) = 1
[2] Where x, y and z are numbers greater than that about 0.01 and x + y + z = 1
[3] Where v, x, y and z are numbers greater than about 0.01 and v + x + y + z = 1
[4] Where u, v, x, y and z are numbers greater than about 0.01 and u + v + x + y + z = 1
[5] where t, u, v, x, y and z are numbers greater than about 0.01 and t + u + v + x + y + z = 1.

Table II gives numerous examples of novel semiconductor compositions which can be made by the method of the present invention and establishes that the bounds of the novel compositions which can be made by the present invention cannot be properly stated except by the inventive method. Beyond the scope of Table II and the invention are known and novel semiconductor and non-semiconductor compositions containing Group IIb-VIa and Groups IVa-VIa semiconductors such as cadmium sulfide, cadmium selenide, zinc oxide, tin oxide However telluride lead can be used with the present invention. Similarly elements from Group IIIa, IVa and Va of the Periodic Table, include bismuth, lead and thallium, may be contained in novel compositions made by the present invention. It would seem that virtually any substantially homogeneous (or solid solution) semiconductor composition that can or has been conceived can be prepared by the described method provided at least one of the components can be contained in a reactive gas and at least one of the components can be sputtered from a sputter target.

Table II does show that certain novel pseudobinary semiconductor systems can be made by the present invention. Such novel binary semiconductor compositions have the formula: $(A)_{1-x}(B)_x$, where A is a Group IIIa–Va semiconductor compound selected from the group consisting of BN, AlN, GaN, InN, BP, AlP, GaP, InP, AlAs, GaAs, InAs, AlSb, GaSb and InSb, B is a Group IVa element selected from the group consisting of Si, Ge and Sn, and x is a number greater than about 0.01 and preferably greater than 0.05 where $x+(1-x)=1$. Of these compositions, the BP, AlP, GaP, InP, AlAs, GaAs, InAs, AlSb and GaSb compositions are of more interest because of their greater compatibility in lattice structure with the Group IVa elements, and $(GaAs)_{1-x}Si_x$, $(GaAs)_{1-x}Ge_x$, $(InSb)_{1-x}Si_x$, $(InSb)_{1-x}Ge_x$, $(InAs)_{1-x}Si_x$ and $(InAs)_{1-x}Ge_x$ are of greatest interest. GaAs-Si and GaAs-Ge systems were previously reported as essentially non-miscible systems. These novel compositions are, therefore, of great interest in making semiconductor devices requiring unique semiconductor parameters, particularly in epitaxial layers as the present invention provides.

Moreover, Table II shows that a broader class of novel compositions can be made to provide semiconductor devices in accordance with the present invention. These novel compositions have the general formula: $(A_1)_{x1}(A_2)_{x2} \ldots (A_n)_{xn}$ where $A_1, A_2 \ldots A_n$ are each selected from the group consisting of Group IIIa–Va and IVa–IVa BN, AlN, GaN, InN, BP, AlP, GaP, InP, AlAs, GaAs, InAs, AlSb, GaSb, InSb, and GeSi and Group IIIa, IVa and Va elements, and the $A_1, A_2 \ldots A_n$ contain at least one of the Group IIa–Va and IV–Va semiconductor compounds, at least one Group IVa element selected from Si and Ge, or at least one Group IIIa element and at least one Group Va element; where $x_1, x_2 \ldots x_n$ are all numbers greater than about 0.01 and preferably greater than 0.05 where $x_1+x_2+\ldots+x_n=1$; and where n is an integer greater than 2 other than 4 where $A_1, A_2, A_3$ and $A_4$ are all semiconductor compounds. The Group IIIa elements are boron (B), aluminum (Al), gallium (Ga), indium (In) and thallium (Tl); the Group IVa elements are carbon (C), silicon (Si), germanium (Ge), tin (Sn), and lead (Pb); and the Group Va elements are nitrogen (N), phosphorus (P), arsenic (As), antimony (Sb) and bismuth (Bi). In this connection, it should be noted (i) that partially soluble solutions of $(A_1)(A_2)(A_3)(A_4)$ compositions where $A_1, A_2, A_3$ and $A_4$ are all IIIa–Va compounds have been achieved by other means, see J. L. Richards, "Solubility Studies in Semiconductor Alloy Films", *The Use of Thin Films in Physical Investigations*, ed. J. C. Anderson (1966), p. 419 and (ii) that InBi, TlSb and TlBi are reported as metallic compositions, see O. Madelung, *Physics of III–V Compounds*, (1964), p. 8.

Of these novel compositions of the formula, the compositions where n is a digit and preferably less than 7 and more preferably $n=3$ are of particular interest in making semiconductor devices. The ternary compositions are of greatest importance which have the general formula $(A_1)_x(A_2)_y(A_3)_z$ where $A_1, A_2$ and $A_3$ are elements each selected from Group IIIa, IVa and Va elements B, Al, Ga, In, Si, Ge, Sn, N, P, As and Sb where $A_1, A_2$ and $A_3$ contain at least one Group IVa element selected from Si and Ge or at least one Group IIIa and at least one Group Va element, and where x, y and z are each numbers greater than about 0.01 and preferably greater than 0.05 where $x+y+z=1$. Of these ternaries, $Ga_xAs_ySi_z$, $Ga_xAs_yGe_z$, $Ga_xSb_ySi_z$, $Ga_xSb_yGe_z$, $Ga_xAs_ySb_z$, $In_xSb_ySi_z$, $In_xSb_yGe_z$, $In_xSb_yAs_z$, $In_xAs_ySi_z$ and $In_xAs_yGe_z$ are of greatest interest.

With regard to all of these general formulas, it should be recognized that the composition of each of the components is greater than about 0.01 and preferably greater than 0.05. A composition with a lesser amount of a component acts as a different composition absent the component of lesser amount, or as a different composition doped with the component of lesser amount. For example, AsSiIn, where As and In are present in amounts of $10^{-12}$ to $10^{-20}$ atoms/cm$^3$, is simply silicon compensation doped with arsenic and indium. In addition, it is apparent to one skilled in the art that where a semiconductor composition is desired, the components must be varied within the formula so that the semiconductor elements or semiconductor compounds dominate, or the IIIa–Va elements in proper balance dominate. And Sn is preferred in a crystal form where it is semiconducting. However, non-semiconductor compositions within the general formula may have utility, for example, in making integral sputter targets as hereinafter described.

Table II also establishes preferred operation for compounding with the present invention. Generally, sputtered species deposit in the layer on substrate unchanged, i.e. they retain their compound integrity, while gas species deposit in the layer in elemental form. Thus, compounds are typically deposited from the sputter target and elements deposited from the reactive gas to provide greater latitude in the operating conditions. To have the compound formed by the reaction of reactive gases, the concentration and partial pressure of the reactive gases and the substrate temperature require careful control to provide the desired compound in a homogeneous composition.

On the other hand, the difficulty in depositing from the sputter target is that (i) ionization sometimes causes disassociation of weakly bonded elements in a compound, and (ii) that, where two or more compositions are sputtered, physical separation of multiple sputter targets cause non-uniformity in the sputtered composition and in turn non-homogeneity in the deposited composition. Where the former difficulty arises, the compound is preferably deposited by electrical discharge reaction of reactive gases. Where the latter difficulty arises, a single integral sputter target containing a composition of two or more materials to be sputtered may be prepared by use of the present inventive method.

That is, an electrode suitable for a sputter target electrode may be disposed in the position of the substrate in FIG. 1. Two or more materials may be deposited on the electrode by the method above described to form on the electrode an integral sputter target of a substantially homogeneous composition containing the desired compounds desired to be deposited on the substrate. Thereafter, the electrode with the target composition thereon is positioned in the apparatus of FIG. 1 as the sputter electrode-sputter target assembly. The desired semiconductor compounds can thus be simultaneously sputtered from the single integral sputter target. Alternatively, a single target can be made with pieshaped or checkerboard pieces of the different compounds to be sputtered; however, this type of target its generally more difficult and expensive than the above-described integral sputter target containing a substantially homogeneous composition of two or more materials to be sputtered.

It should also be noted in connection with Table II, as with Table I and the general operation of the apparatus of FIG. 1, that an additional gas may be required in mixture with the reactive gas to provide for the electrical discharge reaction. For example, hydrogen gas ($H_2$) may be inserted to reduce $SiCl_4$ and $In(CH_3)_3$ and provide HCl and $CH_4$ as by-products. This can be simply done by addition of another vessel and valve connection to the mixing chamber in the apparatus of FIG. 1. Further, in connection with Table II, it should be noted that the target and reactive gas compositions listed are merely examples selected to illustrate various of the starting compositions and are not necessarily the most preferred starting materials to making the particular composition.

As previously noted, Table II shows that substantially homogeneous (or solid solution) compositions can be made by the inventive method of materials previously reported as "non-miscible". Specifically, the maximum solubility of Si in bulk GaAs is reported as approximately 0.5%. For this reason the system $(GaAs)_{1-x}Si_x$ was investigated most fully.

Using the apparatus as described in FIG. 1, $(GaAs)_{1-x}Si_x$ layers were epitaxially grown on single-crystal substrates of gallium arsenide. The apparatus was vaculated and back-filled with argon to $2 \times 10^{-3}$ torr. After brief clean-up sputtering, the reactive gas, silane ($SiH_4$), was leaked into the chamber and the shutter pivoted to begin the deposition on the substrate. Applied to the sputter electrode was an RF potential of about 1000 volts (i.e. about 1.3 watts/cm$^2$) at a frequency of 13.56 MHz. The substrate was heated and maintained at a temperature between 530° and 600° C. during the deposition. The layers thus made were examined to determine their composition.

X-ray diffraction was used to determine the lattice parameter, $a_o$. Using the GaAs substrate as reference, values to within an accuracy of ±0.01 Å were easily obtained. The x-ray data confirmed for all compositions that only a single phase of a disordered zinc blend structure was present.

Figure 3:
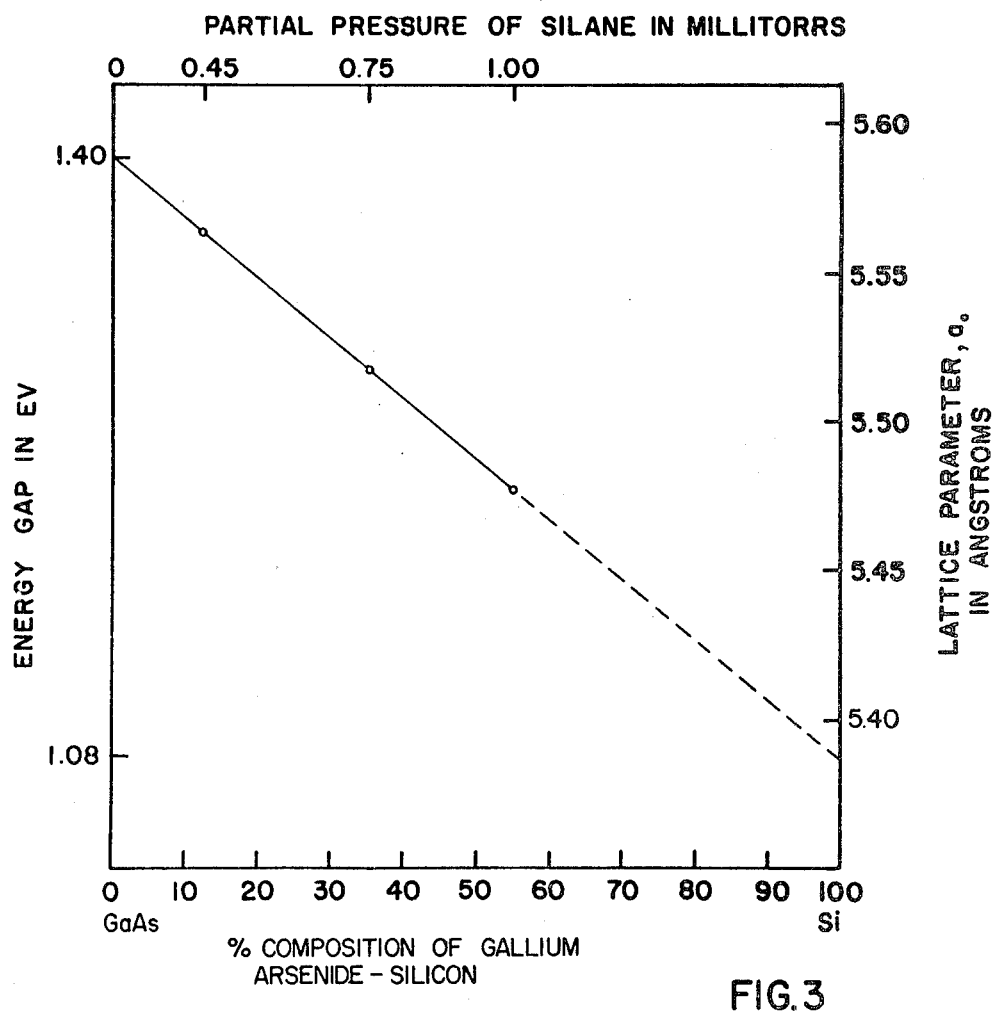
FIG. 3 is a graph showing the change in energy gap and lattice spacing with change in percentage composition and with change in partial pressure of silane gas of gallium arsenide and silicon in a solid layer of the present invention.

Compositions were determined from electron microprobe data. In this measurement raw intensity data are submitted to a standard computer program. A plot of lattice spacing, $a_o$, versus composition in FIG. 3, shows conformity to Vegard's Law of linear change of lattice parameter with composition. In the more easily miscible systems, such behavior is indicative of homogeneity in well-equilibrated systems.

Optical transmission measurements were made with a Cary spectrophotometer at wavelengths between 0.7 and 2.5 μm (1.76 and 0.49 eV). For the measurements, the compositions were constrained to flat surfaces of high purity silica blanks by a non-absorbing resin. The GaAs substrates were etched away using a bromine-methanol etch. Chemical attack of the solid solution films was imperceptible. The absorption coefficient, $\alpha$, was determined from transmittance data for films of many compositions. Bandgaps, $E_g$, were then determined by plotting $\alpha^2$ vs ($h\nu$-$E_g$) or $\frac{1}{2}$ vs ($h\nu$-$E_g$). Straight line intercepts of the energy axis give $E_g$. All compositions investigated (x<0.55) showed direct transition behavior.

Figure 4:
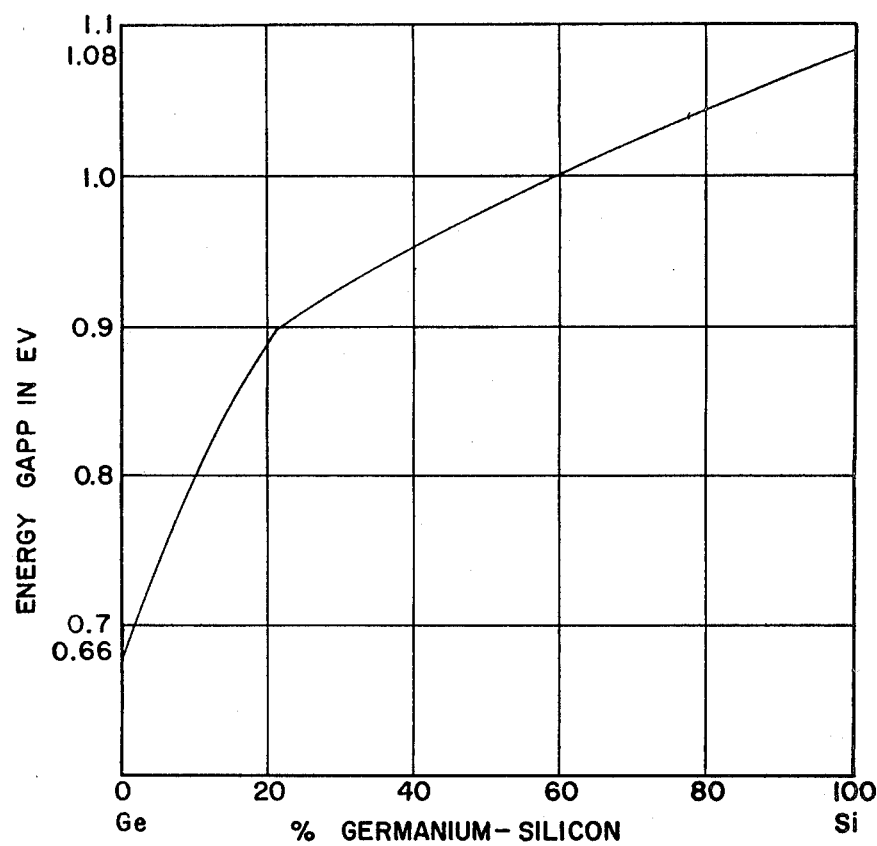
FIG. 4 is a graph showing the change in energy gap with change in percentage composition of germanium and silicon in a solid layer.
Figure 5:
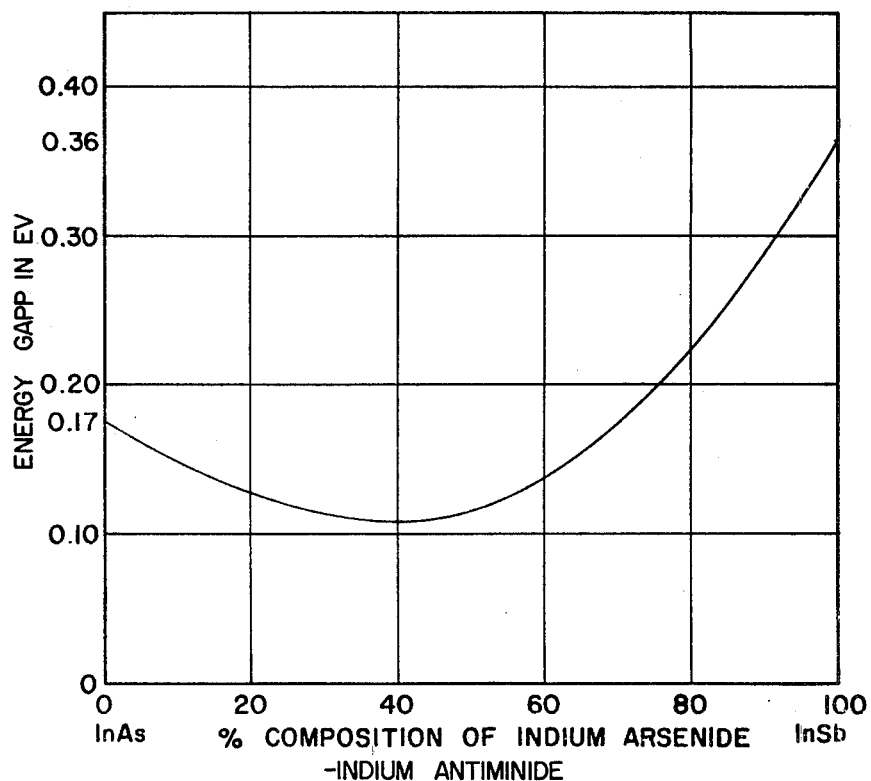
FIG. 5 is a graph showing the change in energy gap with change in percentage composition of indium antimonide and indium arsenide.

Referring to FIGS. 4 and 5, the change in bandgap energy with changes in percentage compositions of the known germanium-silicon and indium antimonide-indium arsenide compositions are shown. The curves show that the change in bandgap energy with changes in composition are not always linear. In the germanium-silicon system the bandgap energy continually increases but contains an inflection in the curve. In the indium antimonide-indium arsenide system a minium of 0.10 eV is observed at 60 mole% indium antimonide.

While presently preferred embodiments have been shown and described with particularity, it is distinctly understood that the invention may be otherwise variously performed within the scope of the following claims.

What is claimed is:

1. A binary semiconductor composition having the formula $(A)_{1-x}(B)_x$ where A is Group IIIa–Va conductor compound selected from the group consisting of BN, AlN, GaN, InN, BP, AlP, GaP, InP, AlAs, InAs and AlSb, B is a group IVa element selected from the group consisting of Si, Ge and Sn, and x is a number greater than about 0.01 such that $x + (1-x) = 1$.

2. A binary semiconductor composition as set forth in claim 1 wherein x is greater than 0.05.

3. A binary semiconductor composition as set forth in claim 1 wherein A is selected from the group consisting of BP, AlP, GaP, InP, AlAs, InAs, and AlSb, 4. A binary semiconductor composition as set forth in claim 1 wherein B is selected from the group consisting of Si and Ge.

5. A binary semiconductor composition as set forth in claim 1 wherein the composition has one of the following formulas: $(GaAs)_{1-x}Si$, $(InAs_{1-x}Si_x$, and $(InAs)_{1-x}Ge_x$.

6. A binary semiconductor composition as set forth in claim 1 wherein B is selected from the group consisting of Si.

7. A semiconductor composition having the formula $(A_1)_{x1}(A_2)_{x2} \ldots (A_n)_{xn}$, where the $A_1, A_2 \ldots A_n$ components are each selected from the group consisting of Group IIIa–Va and IVa–Va compounds BN, AlN, GaN, InN, BP, AlP, GaP, InP, AlAs, GaAs, InAs, AlSb, GaSb, InSb and GeSi, and Group IIIa, Group IVa and Group Va elements, the $A_1, A_2 \ldots A_3$ components contain at least one of the Group IIIa–Va and IVa–IVa compounds, at least one Group IVa elements selected from the Si and Ge, or at least one Group IIIa element and at least one Group Va element; $x_1, x_2, \ldots x$ are all numbers greater than about 0.01 where $x_1 + x_{2\pm} \ldots \pm x_n = 1$ and where n is an integer greater than 2 other than 4 where $A_1, A_2, A_3$ and $A_4$ are all III–V compounds.

8. A semiconductor composition as set forth in claim 7 where $x_1, x_2 \ldots x_n$ are all numbers greater than 0.05.

9. A semiconductor composition as set forth in claim 7 wherein n is less than 7.

10. A semiconductor composition as set forth in claim 7 wherein n is 3.

11. A ternary semiconductor composition having the formula $(A_1)_x(A_2)_y(A_3)_z$, where $A_1, A_2$ and $A_3$ are elements each selected from the group consisting of Group IIIa, IVa and Va elements B, Al, In, Si, Ge, Sn, N, P, As an Sb where $A_1, A_2$ and $A_3$ contain at least one Group IVa element selected from the group consisting of Ge and Si or at least one Group IIIa element and at least one Group Va element; and where x, y and z are each numbers greater than about 0.01 where $x + y + z = 1$.

12. A ternary semiconductor composition as set forth in claim 11 wherein x, y and z are each numbers greater than 0.05.

13. A ternary semiconductor composition as set forth in claim 11 wherein the composition has one of the following formulas: $Ga_xAs_ySb_z$, $In_xSb_ySi_z$, $In_xSb_yAs_z$, $In_xAs_ySi_z$ and $In_xAs_yGe_z$.

14. A binary semiconductor composition having the formula $(A)_{1-x}(B)_x$ where A is a Group IIIa–Va semiconductor compound selected from the group consisting of BN, AlN, GaN, BP, AlP, GaP, InP, AlAs, GaAs, InAs, and AlSb, B is a group IVa element selected from the group consisting of Si and Sn, and x is a number greater than about 0.01 such that $x+(1-x)=1$.

15. A binary semiconductor composition as set forth in claim 14 wherein x is greater than 0.05.

16. A binary semiconductor composition as set forth in claim 14 wherein A is selected from the group consisting of BP, AlP, GaP, InP, AlAs, GaAs, InAs, and AlSb 17. A tenary semiconductor composition having the formula $(A_1)_x(A_2)_y(A_3)_z$, where $A_1$, $A_2$ and $A_3$ are elements each selected from the group consisting of Group IIIa, IVa and Va elements B, Al, In, Si, Ge, Sn, N, P, As and Sb where $A_1$, $A_2$ and $A_3$ contain at least one Group IVa element selected from the group consisting of Ge and Si, or at least one Group IIIa element and at least one Group Va element; and where X, y and z are each numbers greater than about 0.01 where $x+y+z=1$.

18. A ternary semiconductor composition as set forth in claim 17 wherein X, y and z are each numbers greater than 0.05.

19. A ternary semiconductor composition as set forth in claim 17 wherein the composition has one of the following formulas: $Ga_xSb_ySi_z$, $In_xSb_ySi_z$, and $In_xSb_yGe_z$.

* * * * *